United States Patent [19]
Vindasius et al.

[11] Patent Number: 6,098,278
[45] Date of Patent: *Aug. 8, 2000

[54] METHOD FOR FORMING CONDUCTIVE EPOXY FLIP-CHIP ON CHIP

[75] Inventors: Alfons Vindasius, Saratoga; Marc E. Robinson, San Jose; William R. Scharrenberg, Los Altos Hills, all of Calif.

[73] Assignee: Cubic Memory, Inc., Scotts Valley, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/917,447

[22] Filed: Aug. 22, 1997

Related U.S. Application Data

[63] Continuation of application No. 08/374,421, Jan. 19, 1995, Pat. No. 5,657,206, which is a continuation-in-part of application No. 08/265,081, Jun. 23, 1994, Pat. No. 5,675,180.

[51] Int. Cl.[7] .................................................... H05K 3/36
[52] U.S. Cl. ........................ 29/830; 174/52.4; 361/784; 361/790
[58] Field of Search .............................. 29/830; 361/784, 361/790; 174/52.4, 266

[56] References Cited

U.S. PATENT DOCUMENTS

| | | |
|---|---|---|
| 3,648,131 | 3/1972 | Stuby . |
| 4,074,342 | 2/1978 | Honn ........................................ 257/747 |
| 4,706,166 | 11/1987 | Go . |
| 4,764,846 | 8/1988 | Go . |
| 5,422,435 | 6/1995 | Takiar et al. . |
| 5,495,398 | 2/1996 | Takiar et al. . |
| 5,502,289 | 3/1996 | Takiar et al. . |
| 5,600,541 | 2/1997 | Bone et al. . |
| 5,625,230 | 4/1997 | Park ........................................... 257/778 |
| 5,657,206 | 8/1997 | Pedersen et al. . |
| 5,675,180 | 10/1997 | Pederson ................................. 257/686 |
| 5,696,031 | 12/1997 | Wark . |
| 5,708,297 | 1/1998 | Clayton . |

FOREIGN PATENT DOCUMENTS

| | | | |
|---|---|---|---|
| 0314437 | 5/1989 | European Pat. Off. ............... | 257/686 |
| 86-113252 | 5/1986 | Japan . | |

*Primary Examiner*—Carl J. Arbes
*Attorney, Agent, or Firm*—Trial & Technology Law Group

[57] ABSTRACT

A flip chip on chip method for forming a flip chip assembly including a first flip chip; a second flip chip directly connected to the top of the first flip chip; and electrically conductive epoxy means disposed between the second flip chip and the top of the first flip chip to form an electrical connection between the first flip chip and the second flip chip. In another preferred embodiment, a method for forming a flip chip assembly including a plurality of semiconductor chips where the plurality of chips are vertically interconnected on top of one another to form an electrically interconnected stack of chips; a flip chip directly connected to the top chip of the stack of chips; and electrically conductive epoxy means disposed between said flip chip and said top chip to form an electrical connection between the flip chip and the top chip. In still another preferred embodiment, a method of forming a flip chip assembly including a semiconductor wafer having a plurality of first flip-chips formed thereon; a plurality of second flip chips, each one of the second flip chips directly connected to a respective one of the plurality of first flip-chips; and electrically conductive epoxy means disposed between the respective first flip-chip and second flip-chip connections to form an electrical connection between the respective first flip-chip and second flip chip connections.

14 Claims, 17 Drawing Sheets

METHOD FOR FORMING CONDUCTIVE EPOXY FLIP-CHIP ON CHIP

CROSS-REFERENCE TO RELATED PATENT APPLICATIONS

The present application is a continuation of applications Ser. No. 08/374,421, filed Jan. 19, 1995, now U.S. Pat. No. 5,657,206 entitled "Conductive Epoxy Flip Chip", which is a continuation-in-part of application Ser. No. 08/265,081, filed Jun. 23, 1994, now U.S. Pat. No. 5,675,180 entitled "Vertical Interconnect Process for Silicon Segments", both of which are assigned to the same assignee of the present application and both of which are hereby incorporated by reference.

BACKGROUND OF THE INVENTION

The present invention relates to the production of memory modules and other multi-chip electronic assemblies, and more particularly to a method for forming a flip chip configuration for interconnecting multiple die or chips.

There is an ongoing demand for additional semiconductor memory in personal computing applications. One practice is for systems manufacturers to ship personal computer systems with a minimum amount of memory installed and provide a way for the owners to add additional memory as their needs dictate. This protects the manufacturer from sometimes being on the wrong side of a price swing in the volatile semiconductor memory market and also lowers the price of the system being sold.

This practice creates a huge market for low cost, reliable memory modules that can be installed after the initial sale, either by users or other individuals that are not necessarily skilled in the art of computer hardware modification.

The physical need for this market has been met with memory modules such as the 88 pin Personal Computer Memory Card International Association (PCMCIA) card and a variety of Single In-line Memory Modules (known as SIMMs). These devices typically include a printed circuit board (PCB) and a number of discrete integrated circuit memory chips connected to the PCB in a manner that allows the PCB to be easily installed in a computer system.

One problem with the current technology is cost, since users are looking for the lowest cost solution to their memory storage needs. Current technology generally provides two methods of manufacturing memory modules. The most common method is to first package individual semiconductor chips into individual plastic packages, test each chip, and then attach the packages to a PCB, using a multi-step process. The multi-step process includes the steps of attaching the chips to a lead frame, connecting wires to the frame, injection molding the frame, plating the leads with tin, deflashing the molding compounds, bending the leads, testing the package, and so on. Such a multi-step process is both cumbersome and expensive.

Another method for manufacturing memory modules is commonly referred to as "flip chip" technology, which utilizes solder balls to solder chips face-down on a substrate. Flip chips are typically used to create multichip memory modules. One disadvantage of conventional flip chips is that the thermal expansion/contraction properties of the materials used in the manufacturing process must be matched closely to prevent damage to the flip chips during use. Another disadvantage is that standard visual inspections cannot be performed on the flip chips, because the flip chips are attached face-down on the substrate, covering the connection with the substrate.

SUMMARY OF THE INVENTION

Accordingly, it is an object of the present invention to provide an improved flip chip method.

In one preferred embodiment, the present invention provides a method for forming a flip chip assembly including a first flip chip; connecting a second flip chip directly to the top of the first flip chip; and disposing electrically conductive epoxy means between the second flip chip and the top of the first flip chip to form an electrical connection between the first flip chip and the second flip chip.

In another preferred embodiment, the present invention provides a method of forming flip chip assembly including a plurality of semiconductor chips where the plurality of chips are vertically interconnected on top of one another to form an electrically interconnected stack of chips; connecting a flip chip directly to the top chip of the stack of chips; and disposing electrically conductive epoxy means between the flip chip and the top chip to form an electrical connection between the flip chip and the top chip.

In still another preferred embodiment, the present invention provides a method for forming a flip chip assembly including a semiconductor wafer having a plurality of first flip-chips formed thereon; a plurality of second flip chips, connecting each one of the second flip chips directly to a respective one of the plurality of first flip-chips; and disposing electrically conductive epoxy means between the respective first flip-chip and second flip-chip connections to form an electrical connection between the respective first flip-chip and second flip chip connections.

In still another preferred embodiment, the present invention provides a method for producing a multichip assembly including a first flip chip and a second flip-chip. Each of the first and second flip chips include inner bond pads that are rerouted to other areas on the respective flip-chip to facilitate connection with the other flip-chip. The inner bonds are rerouted by covering each chip with a first insulation layer and opening the first insulation layer over the inner bond pads. A metal layer is then disposed over the first insulation layer in contact with the inner bond pads. A second insulation layer is disposed over the metal layer, and the second insulation layer is opened to expose selected portions of the metal layer to form external connection points. Electrically conductive epoxy is then disposed between the external connection points of each of the first and second flip chips, thereby electrically interconnecting the first and second flip-chips.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the following detailed description, serve to explain the principles of the invention:

VIP DRAWINGS

Figure 1:
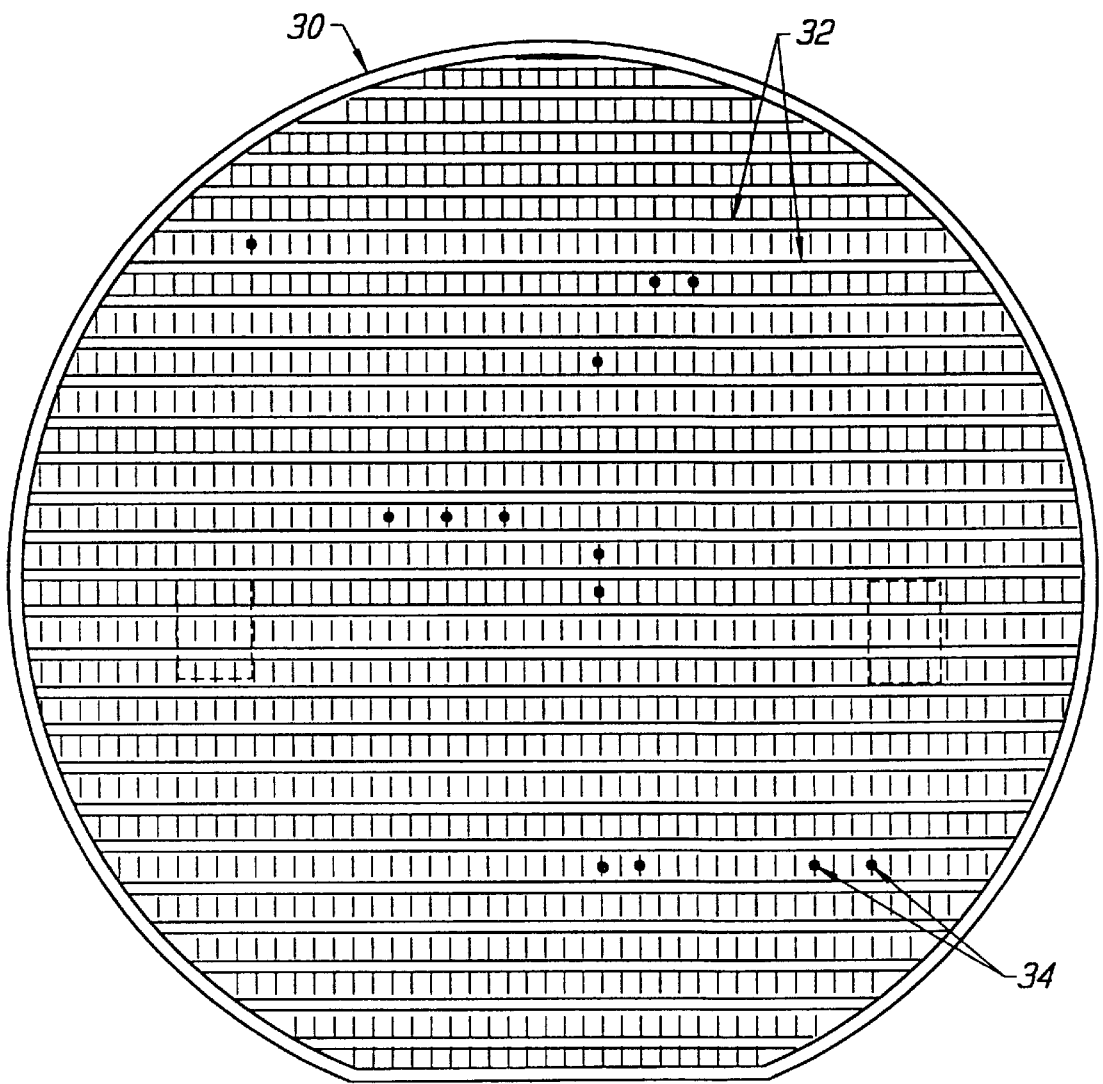

FIG. 1 is diagram illustrating a conventional silicon wafer which includes numerous die.

Figure 2:
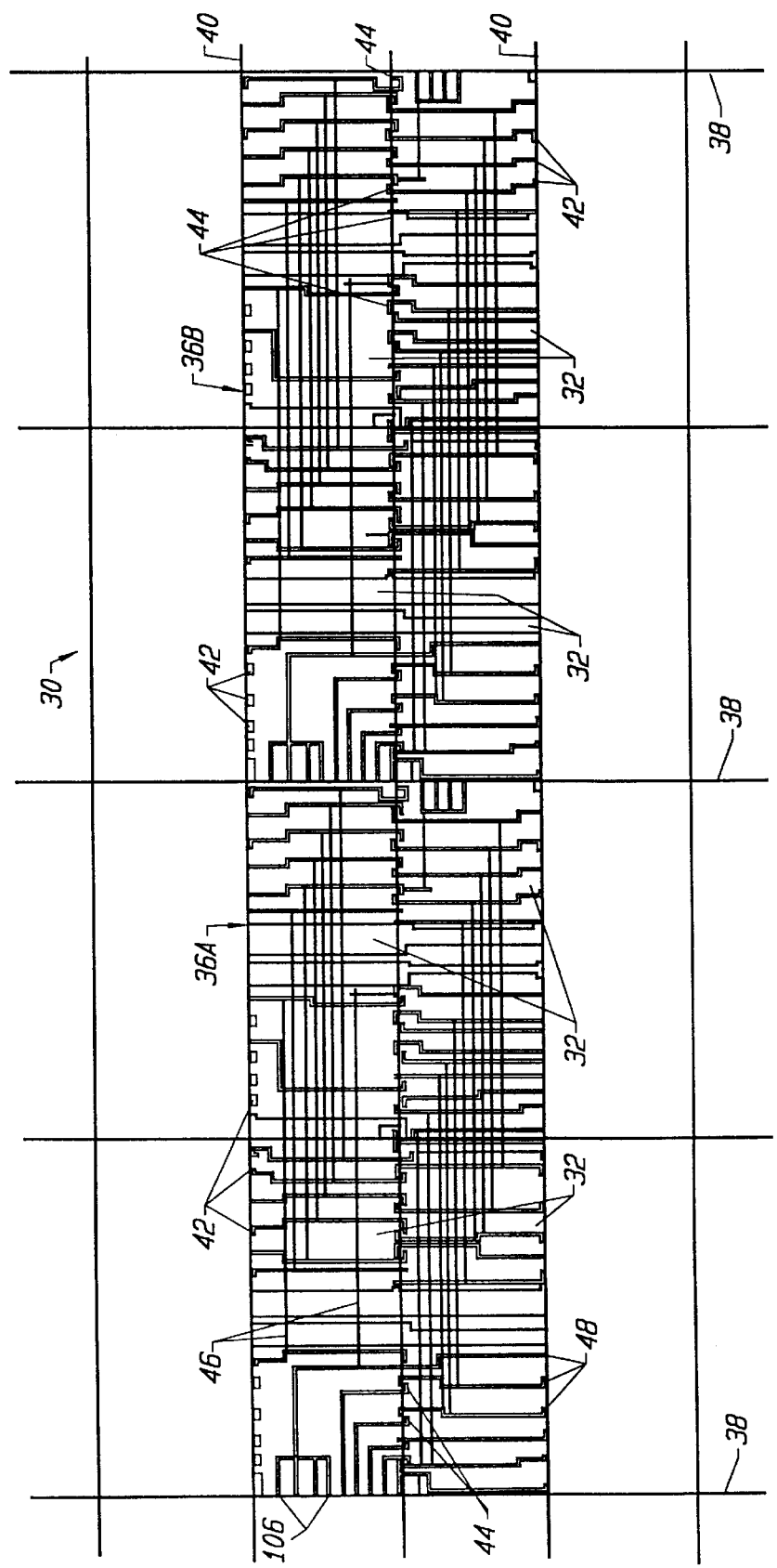

FIG. 2 is diagram illustrating two segments of FIG. 1, where each segment includes a two-by-two array of die.

Figure 3:
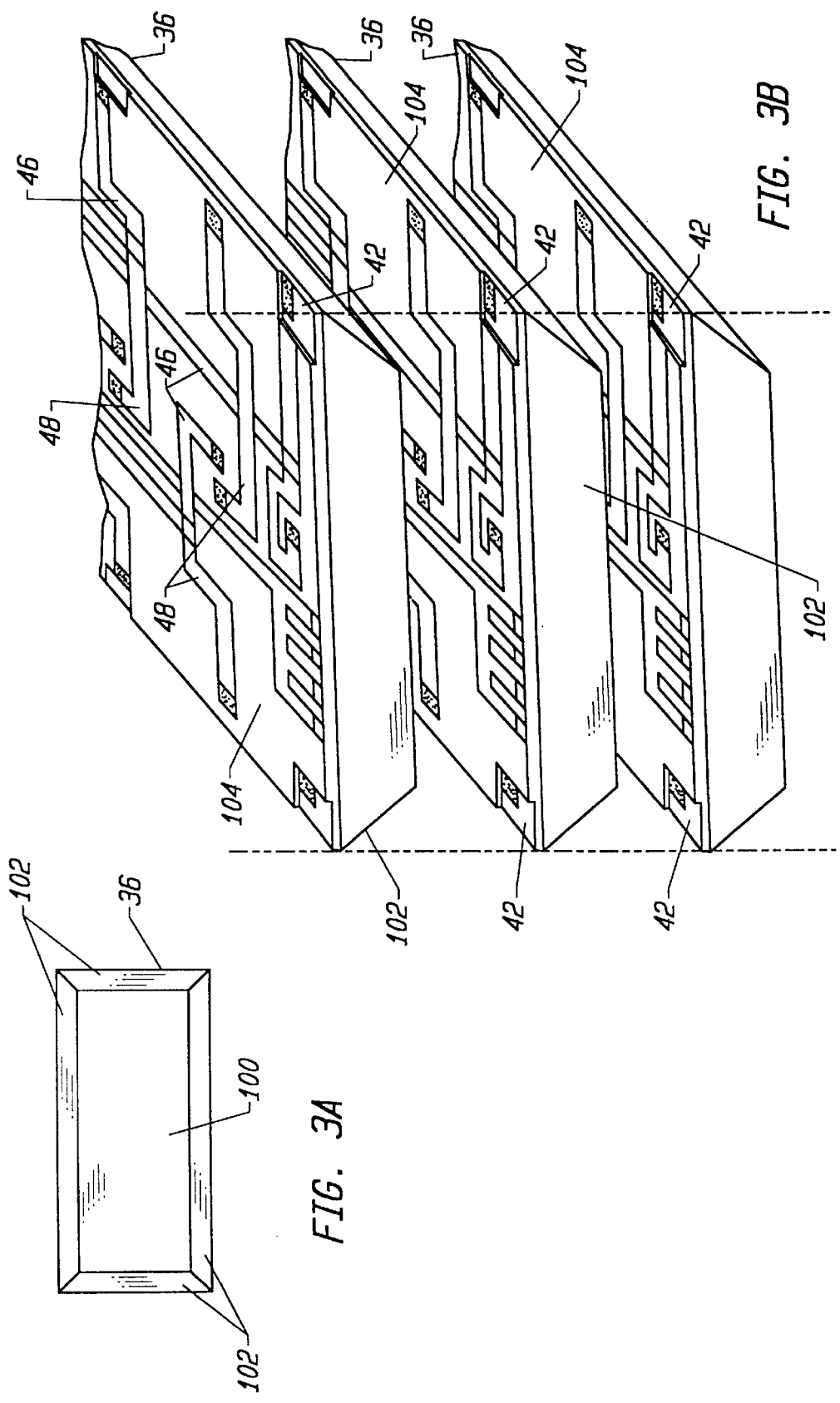

FIG. 3A is a diagram showing the backside of a segment including four beveled side walls after the segment has been cut from a wafer.

FIG. 3B is a diagram showing the front side and the beveled side walls of three segments after being cut from a wafer.

Figure 4:
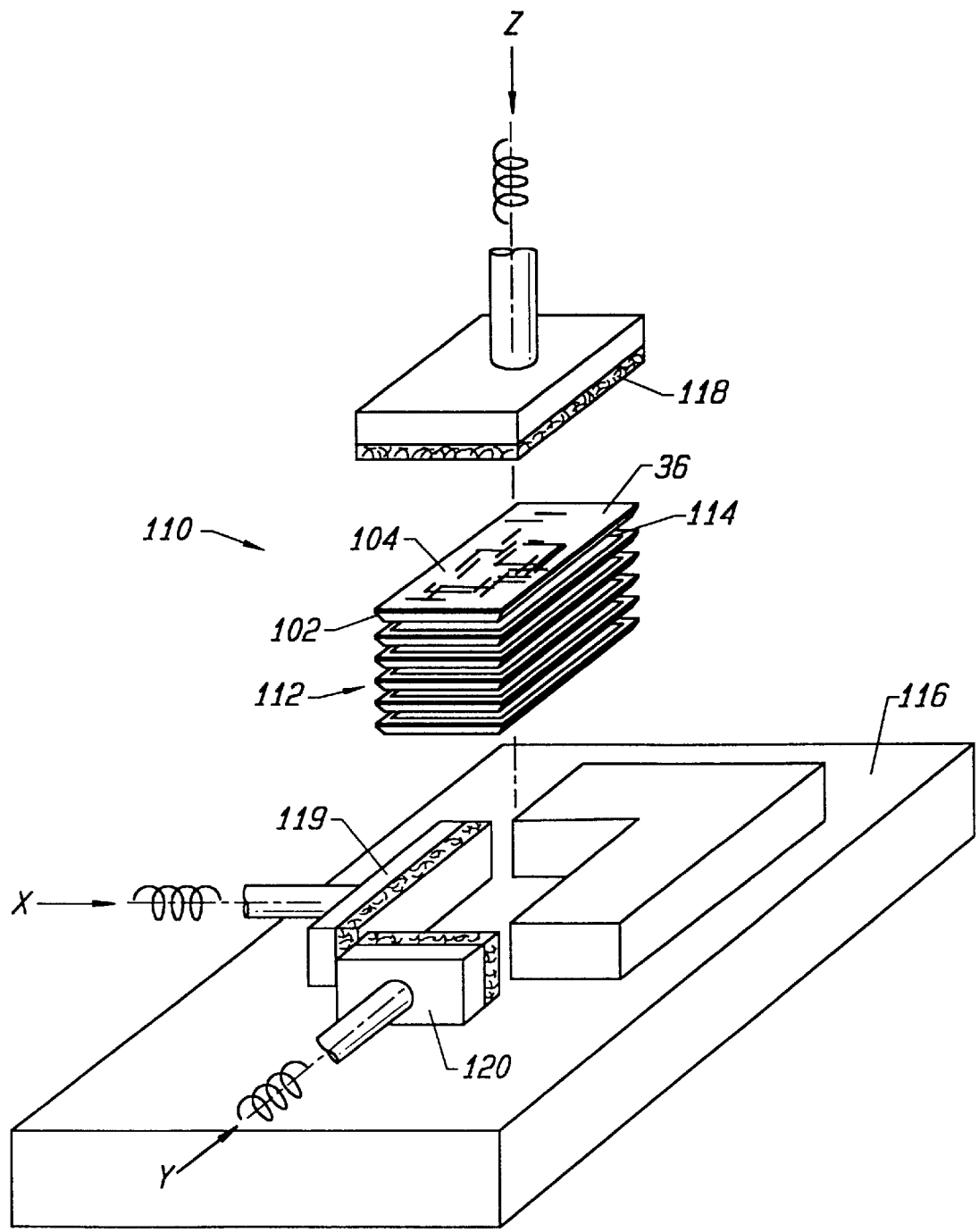

FIG. 4 is a diagram illustrating a segment stacking and gluing procedure in which segments are stacked and epoxied together.

Figure 5A:
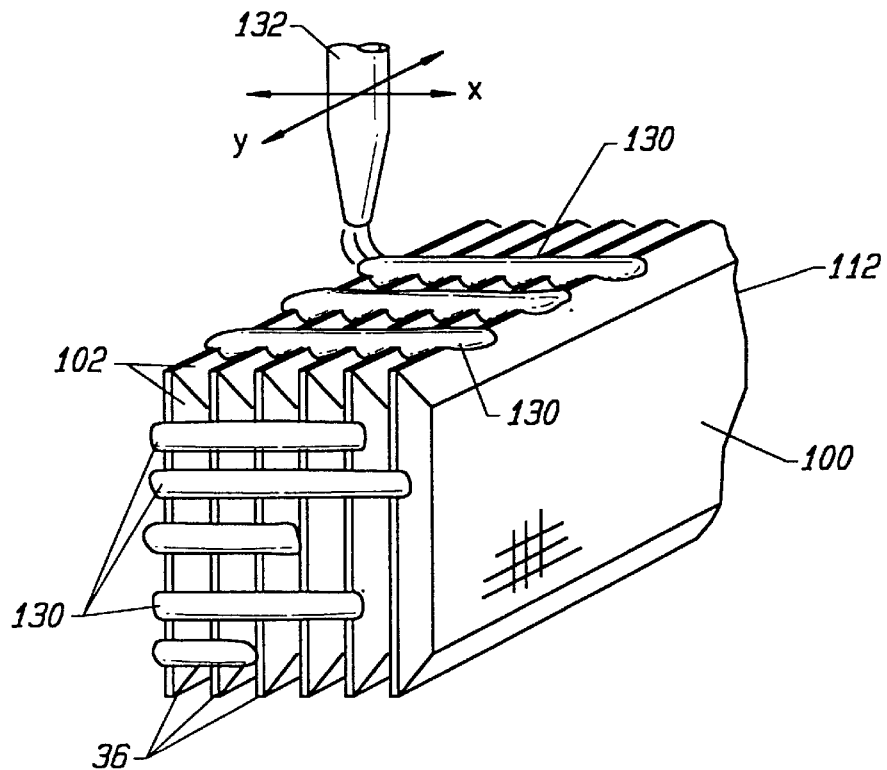
Figure 5B:
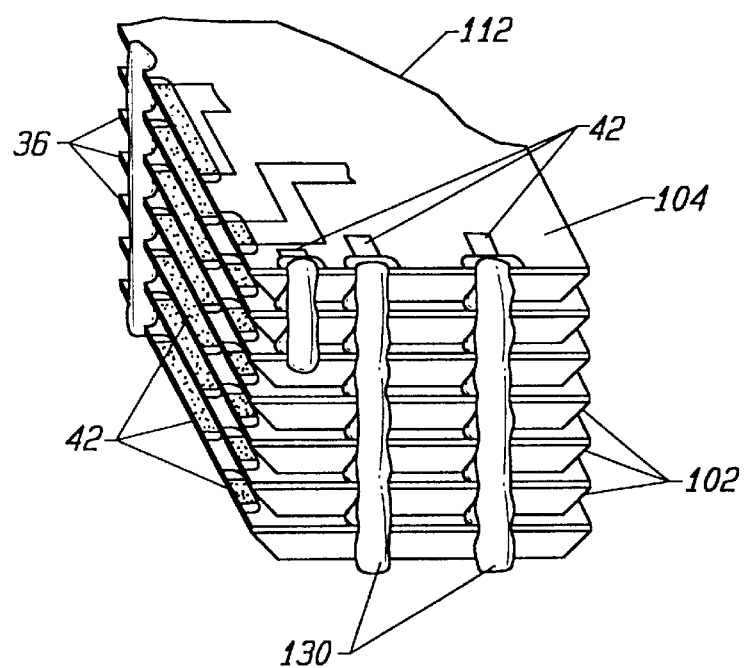

FIGS. 5A and 5B are diagrams illustrating a method for providing a vertical electrical path between segments in a stack.

DCP DRAWINGS

Figure 6A:
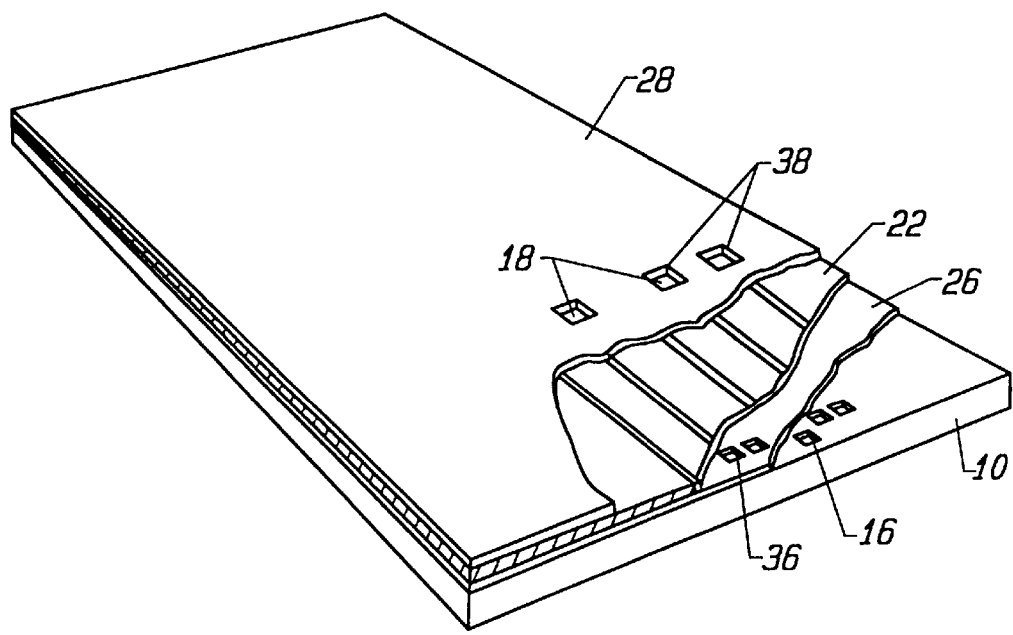

FIG. 6A is diagram illustrating a semiconductor chip.

Figure 6B:
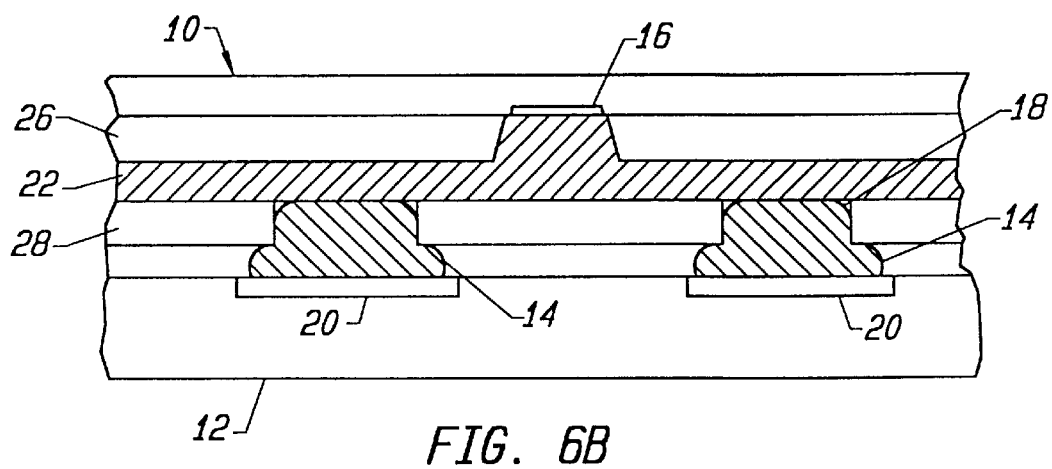

FIG. 6B is a cross-sectional view of a semiconductor chip that is attached face-down on a PCB using electrically conductive epoxy.

Figure 7:
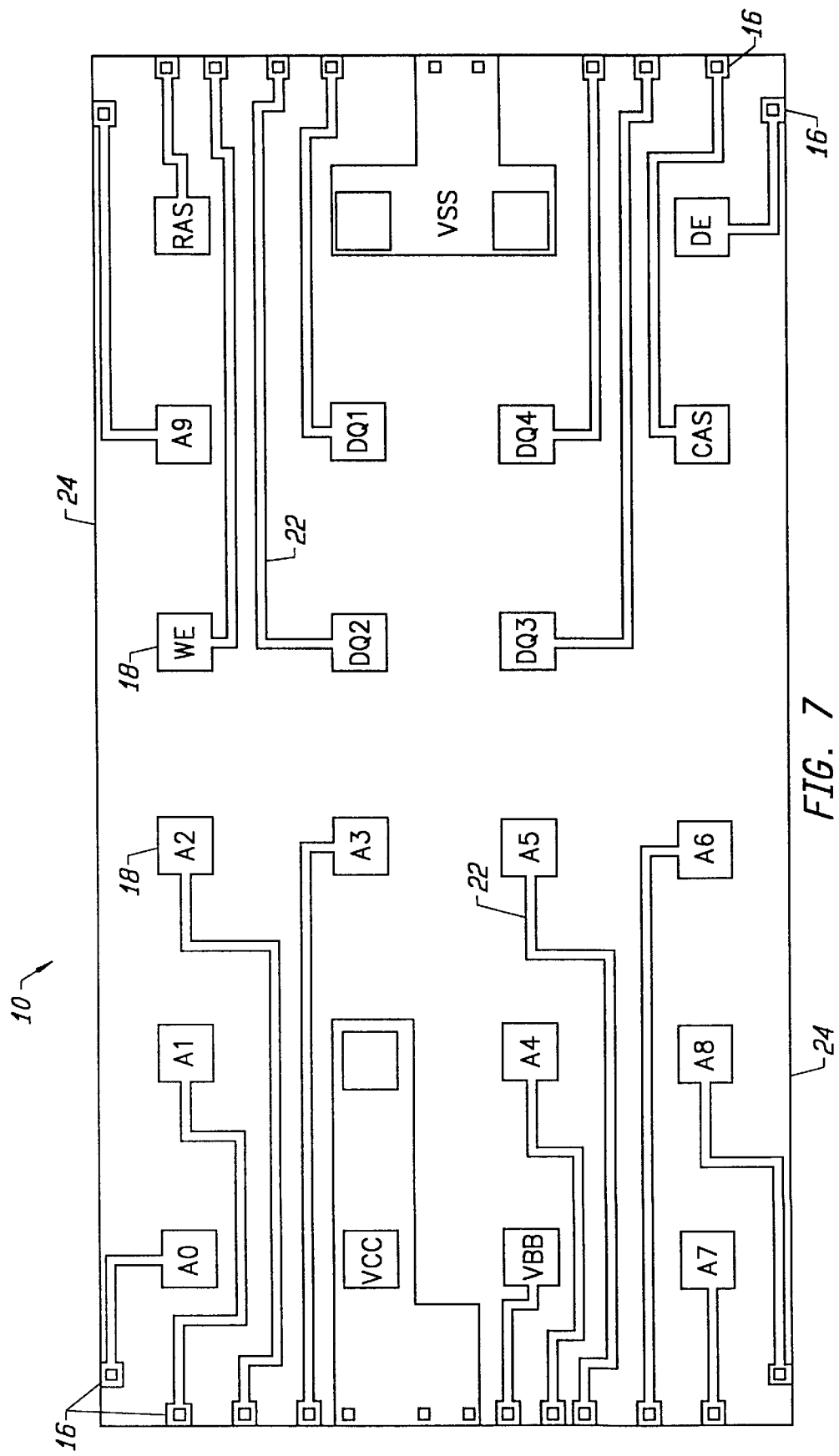

FIG. 7 is a top view of a chip showing the positions of external connection points.

Figure 8:
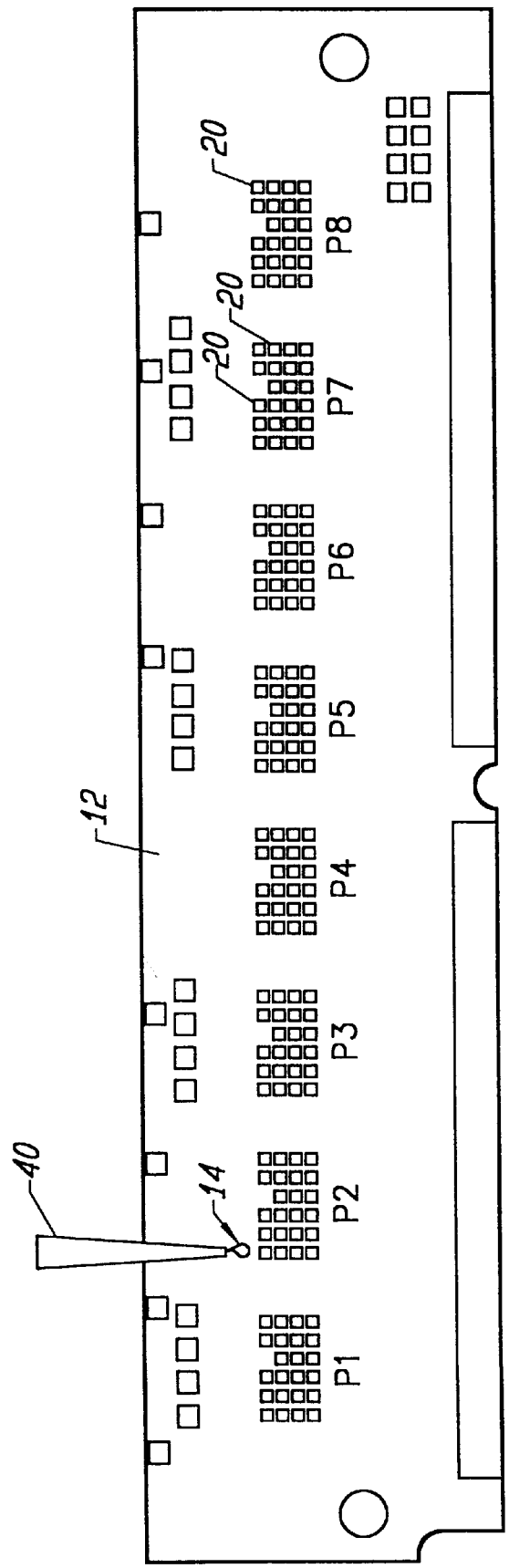

FIG. 8 is side view of a PCB, which is used to create a memory module.

Figure 9:
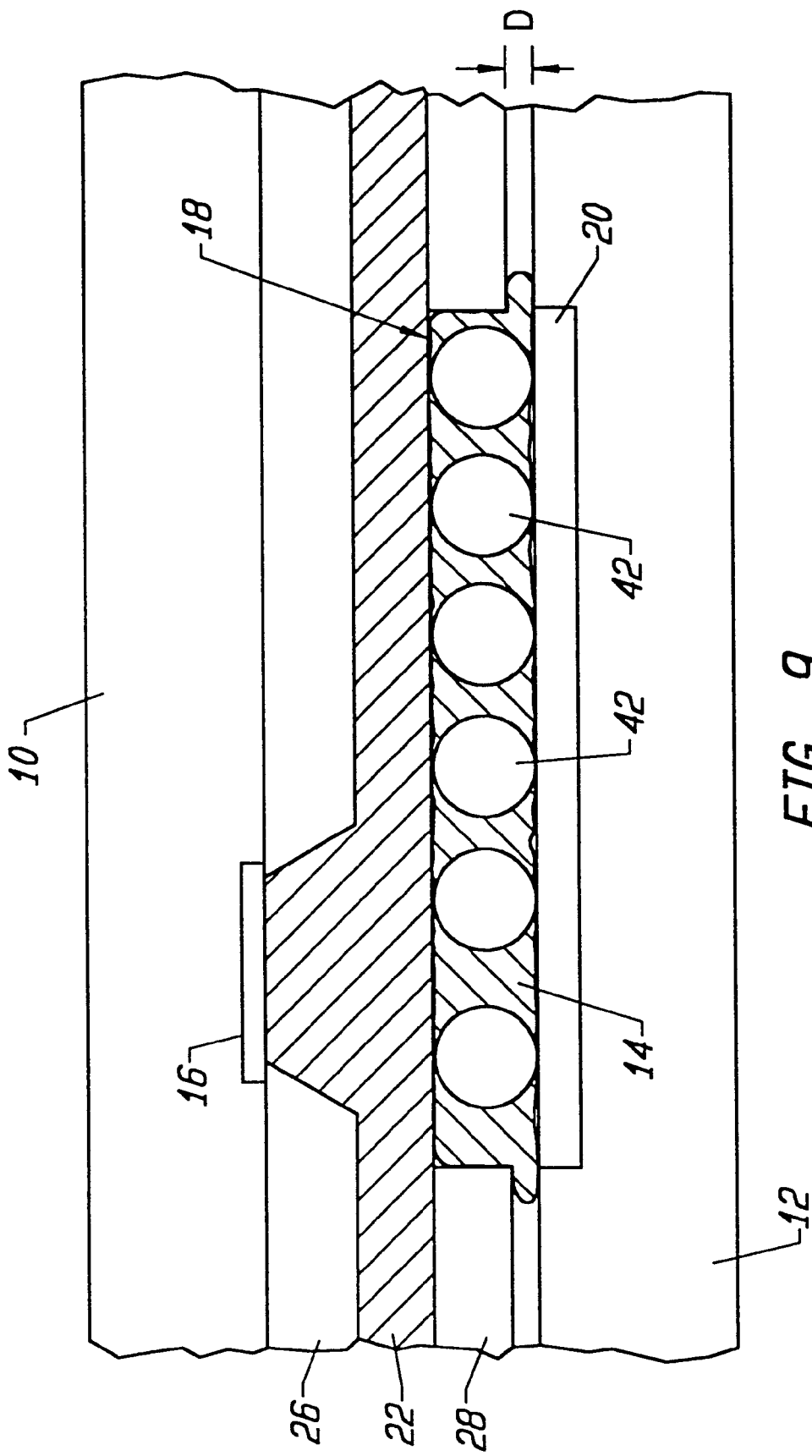

FIG. 9 is a diagram showing the inclusion of glass spheres 42 into conductive epoxy in order to maintain a distance between a chip and a PCB.

Figure 10:
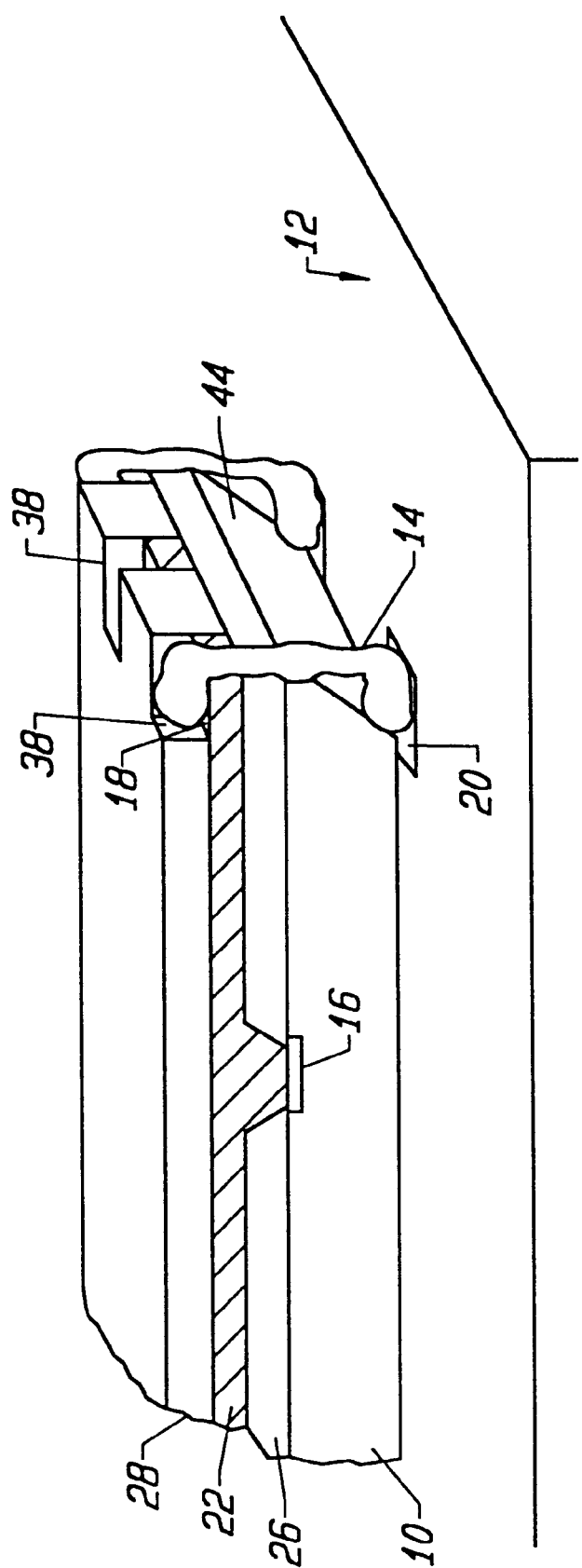

FIG. 10 is a diagram depicting a semiconductor chip attached face-up on a PCB using electrically conductive epoxy.

Figure 11:
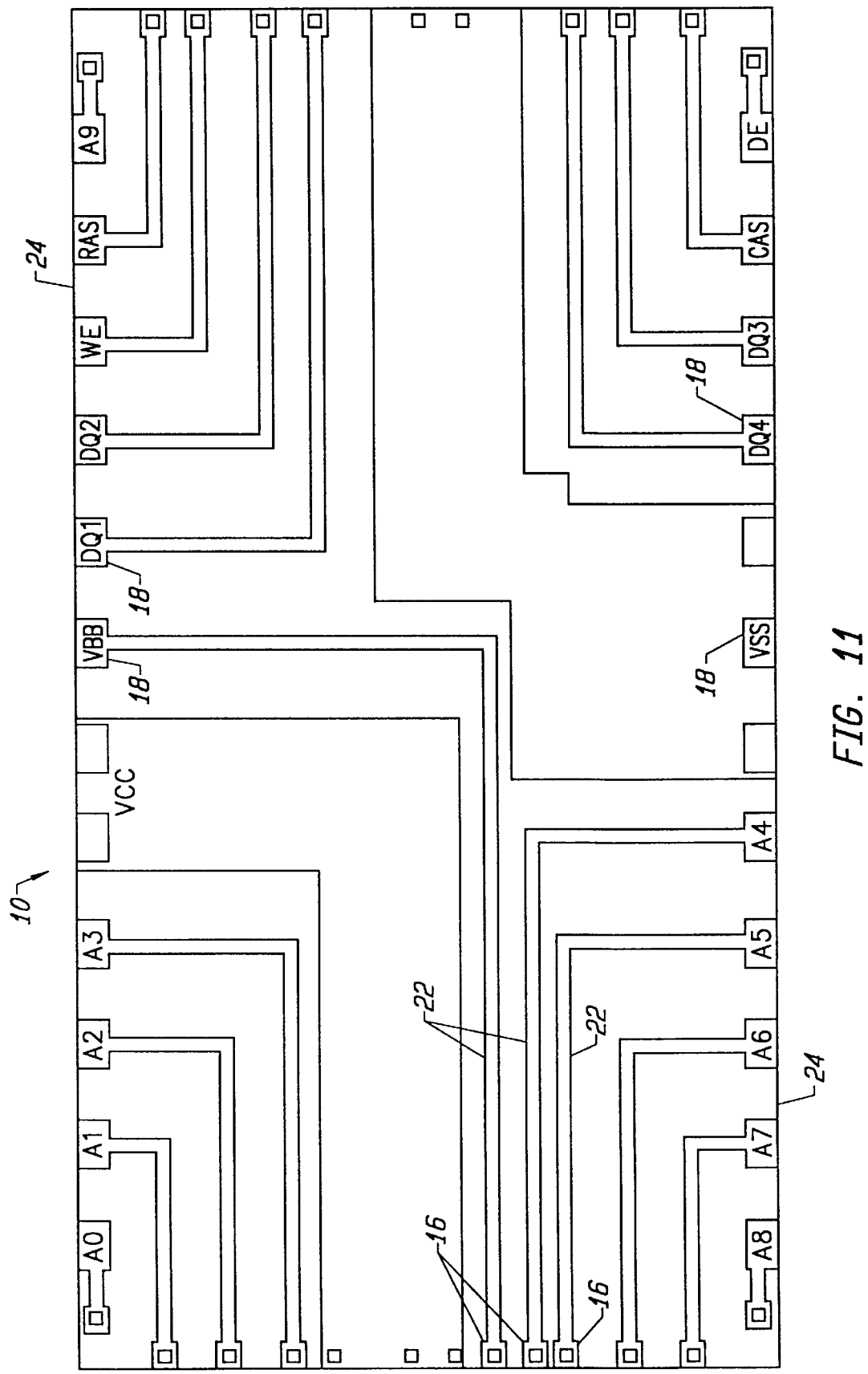

FIG. 11 is a top view of a chip depicting the positions of external connection points.

Figure 12:
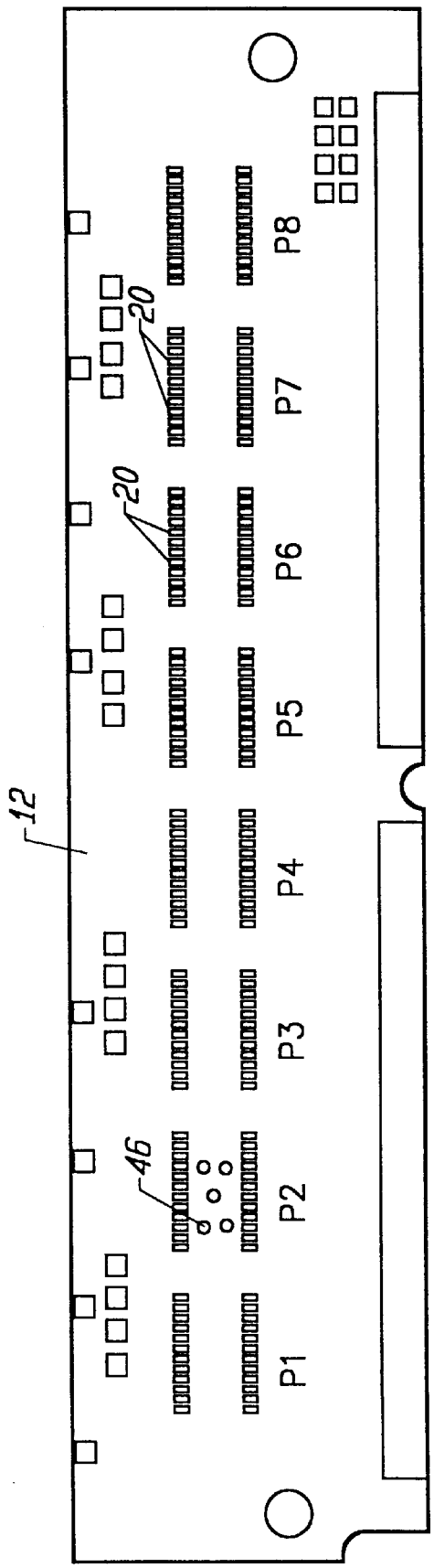

FIG. 12 is side view of a PCB, which is used to create a memory module.

Figure 13:
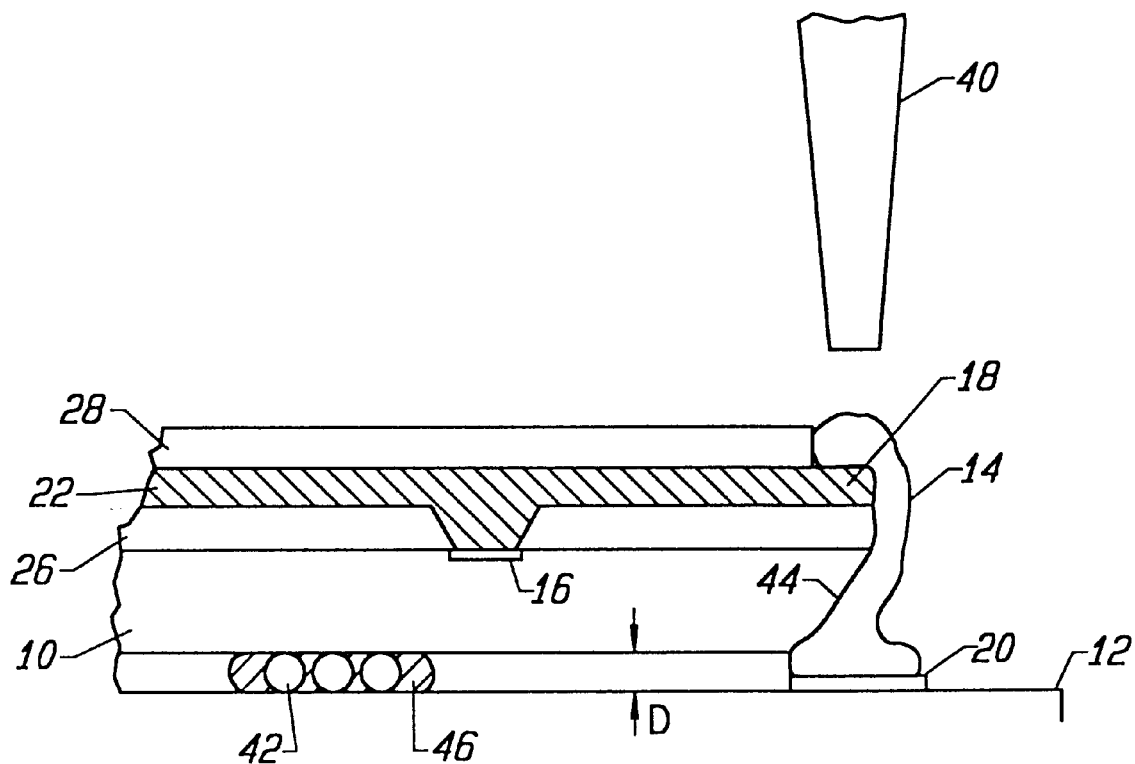

FIG. 13 is a diagram showing the inclusion of glass spheres 42 into surface mount adhesive, which is used to attach a chip to a PCB.

FLIP CHIP ON CHIP DRAWINGS

Figure 14:
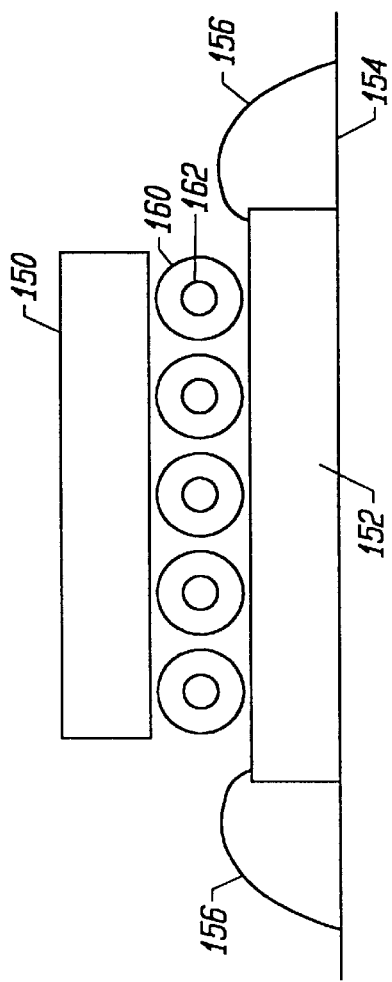

FIG. 14 shows a view of a first embodiment of a flip-chip on chip according to the present invention.

Figure 15:
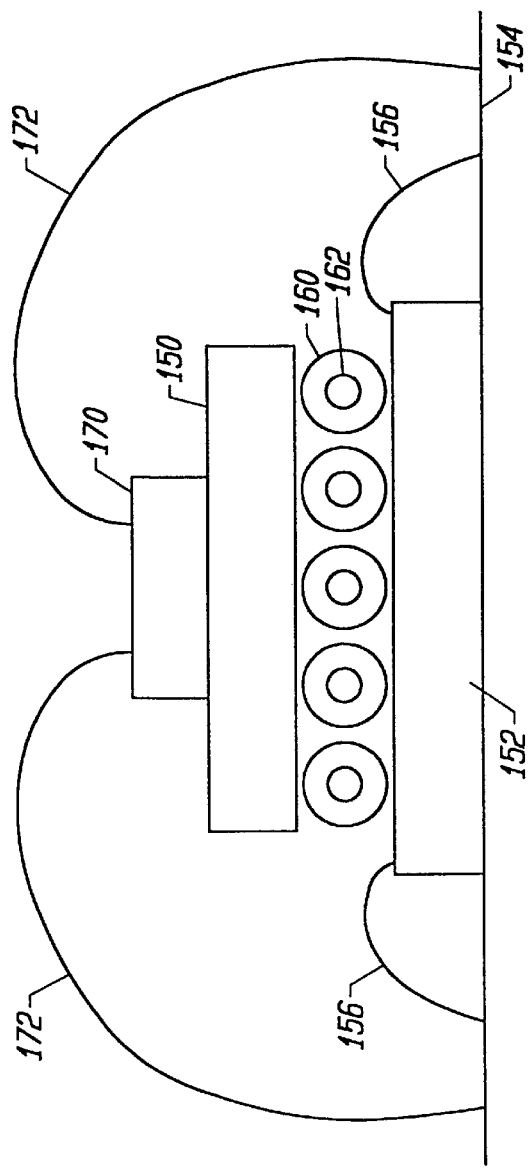

FIG. 15 shows a view of a second embodiment of a flip-chip on chip according to the present invention.

Figure 16B:
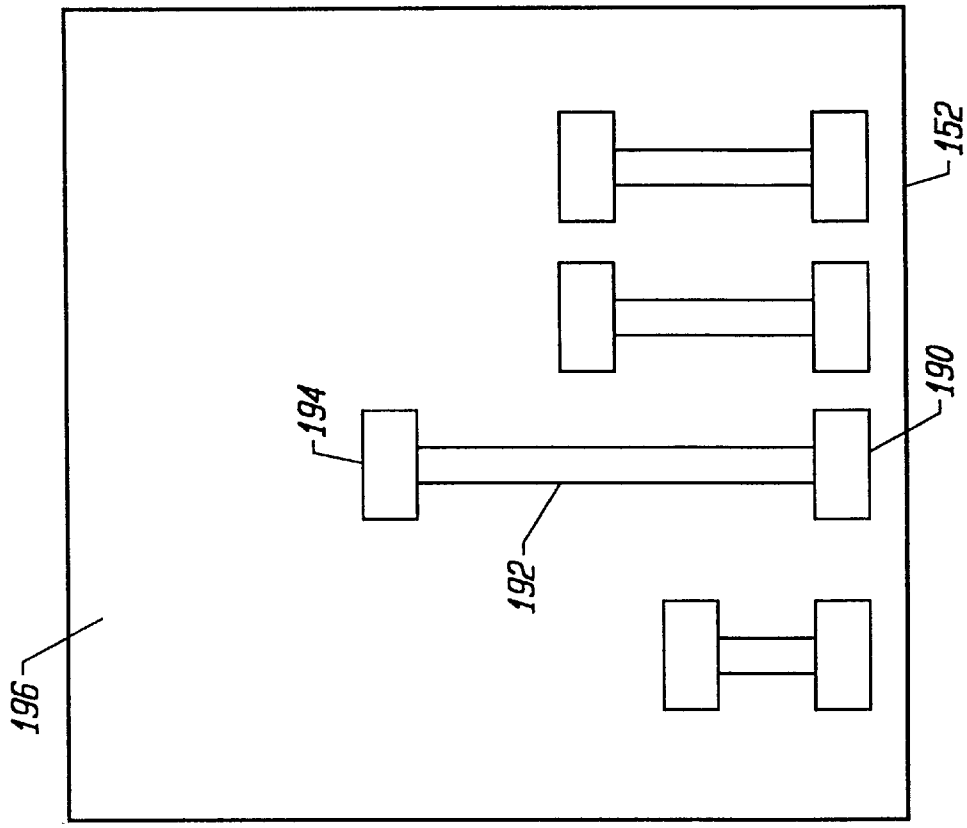
Figure 16A:
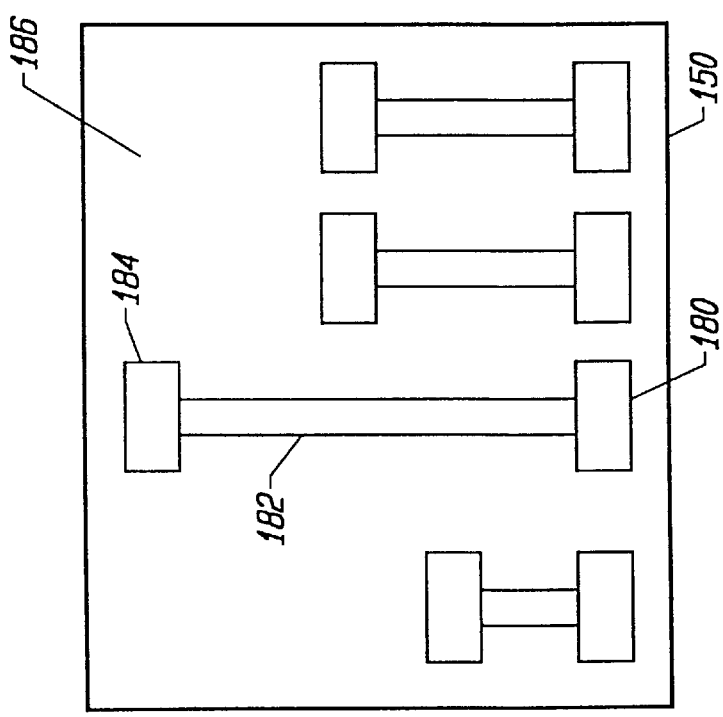

FIGS. 16A and 16B show a view of the relocated pads of each die shown in FIG. 14.

Figure 17:
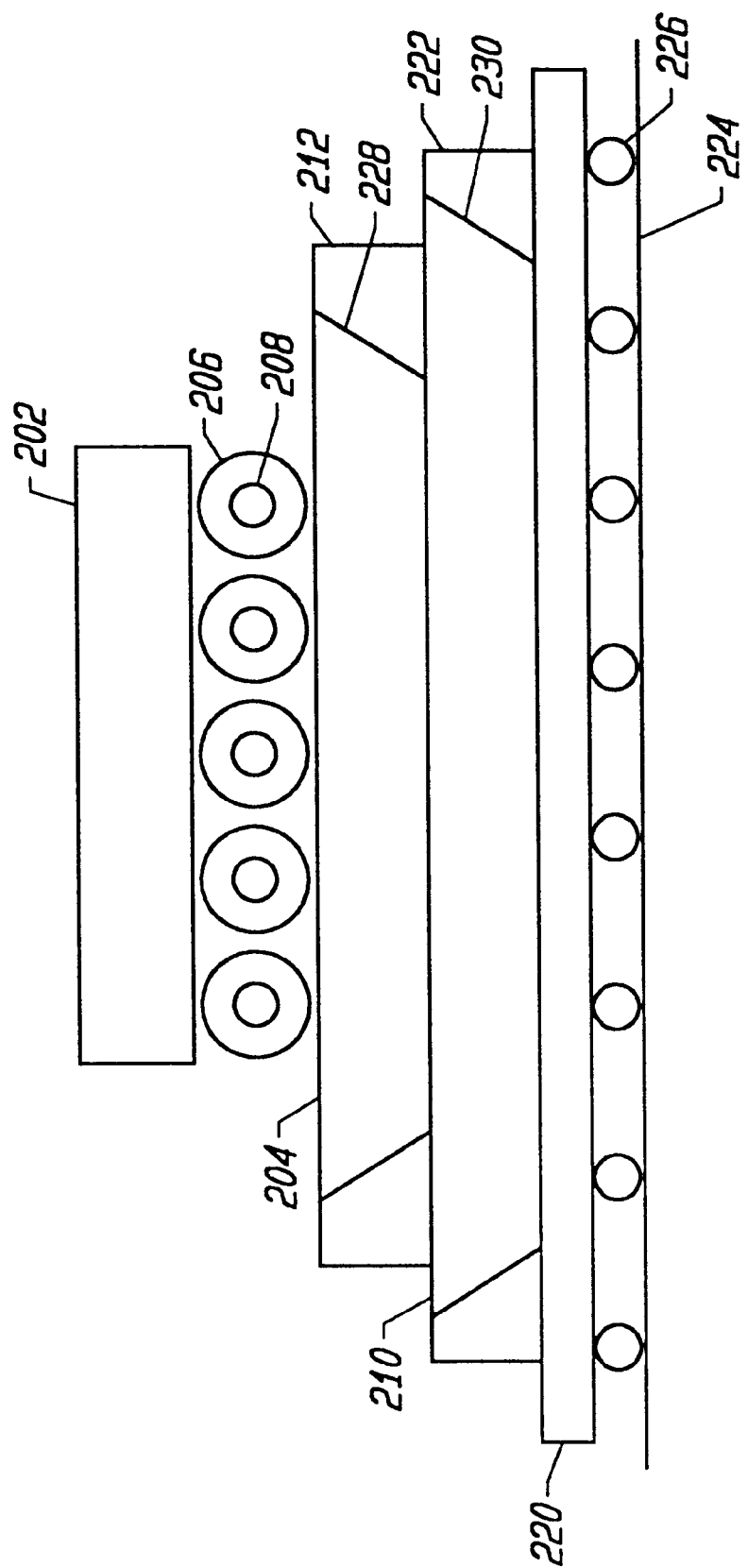

FIG. 17 shows a view of a third embodiment of a flip-chip on chip according to the present invention.

Figure 18:
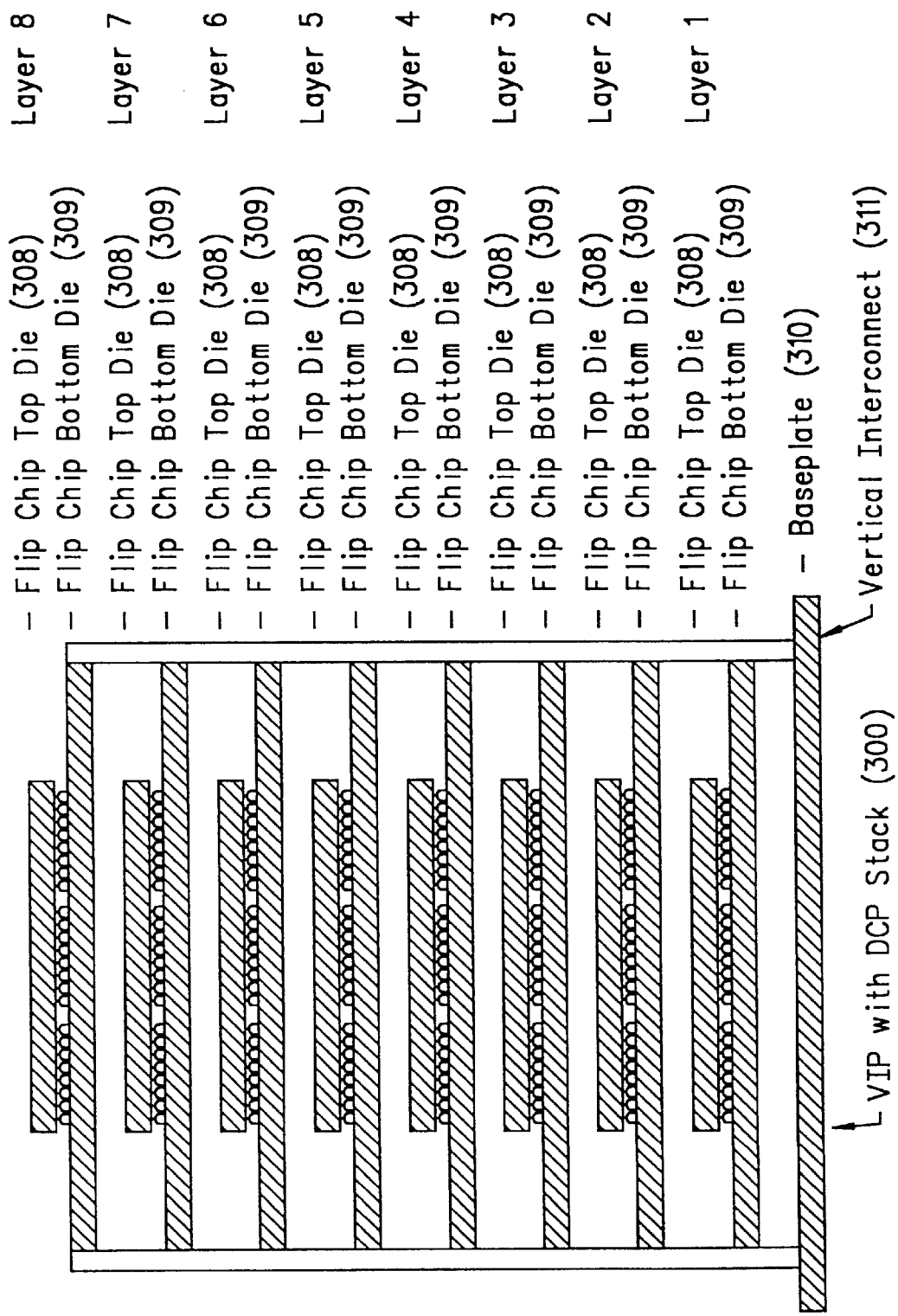

FIG. 18 shows a view of a fourth embodiment of flip-chip on chip according to the present invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

VIP Process Overview

A general overview of the Vertical Interconnect Process (VIP) for Silicon Segments as described in the cross referenced application will first be provided. The VIP process provides a method and apparatus for vertically interconnecting stacks of silicon segments. Each segment includes a plurality of adjacent die on a semiconductor wafer. The plurality of die on a segment are interconnected on the segment using one or more layers of metal interconnects which extend to all four sides of the segment to provide edge bonding pads for external electrical connection points. After the die are interconnected, each segment is cut from the backside of the wafer using a bevel cut to provide four inwardly sloping edge walls on each of the segments.

After the segments are cut from the wafer, the segments are placed on top of one another to form a stack, as distinguished from both a stack of individual chips and a stack of entire wafers. Vertically adjacent segments in the stack are electrically interconnected by applying electrically conductive epoxy to all four sides of the stack. The inwardly sloping edge walls of each of the segments in the stack provides a recess which allows the electrically conductive epoxy to access the edge bonding pads and lateral circuits on each of the segments once the segments are stacked. The stack of electrically interconnected segments is then mounted below the surface of a circuit board and electrically connected to circuits on the board by applying traces of electrically conductive epoxy between the bonding pads on the top segment of the stack and the circuit board.

Referring to FIG. 1, the vertical interconnect process will be described in more detail beginning with a standard wafer 30 which is supplied by a manufacturer. The squares on the wafer 30 indicate the locations of individual die 32 on the wafer 30. Wafers 30 normally arrive from the manufacturer with non-functioning or defective die which are marked with an ink dot 34. In a preferred embodiment of the present invention, the wafer 30 is made of silicon. However, the wafer 30 could also be made using alternate materials, such as gallium arsenide. Typically, the die 32 are cut out of the wafer 30 in order to provide a supply individual chips, such as memory chips, for example. In accordance with the present invention, however, the die 32 are not individually cut out of the wafer 30. Instead, a plurality of adjacent die 32 on the wafer 30 are grouped to form what is referred to as a segment 32, as shown in FIG. 2.

FIG. 2 depicts a plane view of two segments 36A and 36B (hereinafter segments 36) on a wafer 30 where each rectangle represents one die 32. Each segment 36 is defined by vertical boundary lines 38 and horizontal boundary lines 40 and each segment 36 includes a group of adjacent die 32 on the wafer 30, which results in a segment 36 having a particular size and shape. In a preferred embodiment, a segment 36 includes four adjacent die 32 arranged in a two-by-two matrix, as shown. Such a segment 36 is referred to as a two-by-two segment. A segment 36, however, may also include any pattern or arrangement of adjacent die 32, such as for example, a two-by-one segment, a two-by-four segment, or a four-by-four segment of die 32. Each segment 36 is provided with edge bond pads 42 on all four sides of the segment 36, which are used as electrical contact points for external connections. Similarly, each of the die 32 includes internal bond pads 44 for connection with internal circuitry of the die 32. Individual segments 36 are separated from the wafer 30 by cutting the wafer 30 along the vertical boundary lines 38 and horizontal boundary lines 40, which are typically referred to as streets. The process of cutting the segments 36 from the wafer 30 is described further below.

In the VIP process, the individual die 32 on a segment 36 are interconnected using multiple layers of die interconnect circuitry. The die interconnect circuitry includes a plurality of metal traces which are orientated in both the x and y directions on the surface of the segment 32. The metal traces are referred to as x-interconnects 46 and y-interconnects 48 and function to communicate power and signals from the edge bond pads 42 of the segment 36 to selected internal bond pads 44 of the individual die 32.

The two layers of metal interconnects 46 and 48 provided by the wafer interconnect process adds flexibility in routing lines across the wafer 30 to interconnect the die 32 on each segment 36. Interconnecting the die 32 on a segment 36 and then stacking the segments 36, is less costly and more reliable than the prior art method of cutting individual chips from a wafer 30, stacking the chips, and interconnecting the chips on a circuit board.

After the wafer 30 interconnect process, a segment formation process is performed on the wafer 30. Referring again to FIG. 2, the wafer 30 is divided into individual segments 36 by cutting the wafer 30 along the vertical and horizontal streets 38 and 40 between the segments 36. After the segments 36 are cut from the wafer 30, the segments will be placed in a stacked structure. To reduce the overall size of the structure, the segments 36 are first thinned by grinding away material from the backside of the segments 36. To aid in the thinning process, the entire wafer 30 is thinned before the segments 36 are cut from the wafer 30. The thinning process reduces the height of the wafer 30 and the segments 36 from a height of twenty-five mils to approximately eight to ten mils.

Conventionally, wafers 10 are cut from the front side where the circuits are laid so that the circuitry can readily be seen and not damaged during the sawing process. In the present invention, however, the wafer 30 is sawed on the backside of the wafer 30 along the streets 38 and 40 using a bevel cut. FIG. 3A shows the backside 100 of a segment 36 after the segment 36 has been cut from a wafer using a bevel cut. As shown, the bevel cut provides the segment 36 with inwardly sloping edge walls 102 on all four sides of the segment 36.

In order to cut the wafer 30 from the backside 100, a pattern of streets 38 and 40 defining segment boundaries is provided on the backside 100 of the wafer 30 to guide the saw. A pattern of the segment boundaries is provided on the backside 100 placing the wafer 30 in a device including a video camera and a felt-tipped writing device. The wafer is mounted in the device such that the front-side of the wafer 30 faces the camera while the writing device is placed in contact with the backside 100 of the wafer 30. The image of the front-side of the wafer 30 is displayed on a monitor and an operator moves the wafer 30 beneath the writing device along the pattern of the segment boundaries to draw the patterns on the backside 100 of the wafer 30.

Alternatively, a pattern of the segment boundaries may also be provided on the backside 100 of the wafer 30 using a conventional photolithographic process. During this process, the backside 100 of the wafer 30 is coated with photoresist, the front of wafer 30 is illuminated with infrared light such that the circuitry may be seen on the backside 100 of the wafer 30, and a pattern of the segment boundaries is aligned and developed on the surface of the backside 100 of the wafer 30 in order to guide the saw.

After the pattern of the segment boundaries is provided on the backside 100 of the wafer 30, and before the wafer 30 is sawed, a layer of tape is applied to the front of wafer 30 to hold the segments 36 together during sawing. After the front of the wafer 30 is taped, a bevel cut is performed along the segment boundaries on the backside 100 of the wafer 30. In a preferred embodiment of the present invention, the bevel cut produces segment edge walls 102 having a 45-degree angle. After the segments 36 are cut, the tape is carefully removed from the front of the wafer 30 and the segments 36 are cleaned to remove residue from the sawing process and the tape.

FIG. 3B shows three segments 36 placed in vertical alignment above one another, after the segments are cut from a wafer 30, and just before the segments are assembled permanently into a stack. As shown, the front side 104 of each segment 36 contains the metal interconnects 48 and 46, and the edge bond pads 42. Once the segments 36 are assembled into a stack, the edge bond pads 42 of a segment 36 will be in electrical contact with the edge bond pads 42 of vertically adjacent segments 36 in the stack. The purpose of the beveled edge walls 102 is to provide suitable clearance for a vertical electrical connection between the edge bond pads 42 of one segment 36 and the edge bond pads 42 of the segment 36 immediately below the first in the stack.

After cleaning, the backside 100 and the beveled edges 102 of the segments 36 are insulated using a sputtered nitride process. A sputtered nitride process is similar to the sputtering of the metal films, except instead of a metal, a silicon nitride is sputtered onto the backside 100 of the segment 36. The silicon nitride insulation is necessary so that noise and interfering signals are not absorbed into the silicon substrate base of the die 32 on a segments 36.

After the segments 36 are cut from the wafer 30 and insulated, the circuits on the segments 36 are tested for functionality. Since a portion of the die 32 on a wafer 30 may not function, and the defective die are not cut from the wafer 30 and discarded as in prior art methods, the defective die must be disconnected from the functioning die 32. Defective die may be disconnected by using a laser to vaporize the top layer of metal interconnects 46 that are connected between the edge bond pads 42 of a segment 36 and the circuits of the defective die. The defective die may also be disconnected by mechanically abrading or electrically defusing the top layer of metal interconnects 46. Once the top layer of metal interconnects 46 has been opened between the edge bond pads 42 of a segment 36 and the circuits of a defective die, the defective die is no longer electrically connected to the segment 36.

Besides disconnecting defective die, each segment 36 is also made unique so that decoding circuitry, which will interface with the finished stack, may access each segment 36. Each segment 36 is made unique during a process called level programming in which a plurality of control signals is burned on each segment using a laser.

After each of the segments 36 are made unique with respect to one another, the segments 36 are programmed. For the purposes of this disclosure, programming refers to the process of routing circuitry so that redundant functional die 32 replace the disconnected defective die. This is done by providing the replacement die 32 with appropriate control signals originally intended for the disconnected die. Programming is necessary because once the segments 36 are stacked and become operative, a computer or the like may attempt to access a disconnected die in the stack. Therefore, the segments 36 which have defective die must be programmed so that when an attempt is made to access a defective die in a stack, a functioning die 32 is accessed instead. The actual programming of the segments 36 occurs during the fabrication of a stack, as described below.

Referring to FIG. 4, a segment gluing fixture 110 is shown wherein a stack 112 is assembled during a stacking procedure in which the segments 36 are stacked and epoxied together. In a preferred embodiment, during the stacking procedure, a stack 112 is assembled using six adjacent segments 36. A stack 112 is assembled by providing a film of epoxy 114 between each pair of adjacent segments 36, and then placing the segments 36 front side 104 up in an alignment fixture 116. The alignment fixture 116 compresses the stack 112 in a horizontal plane against fixed walls of the fixture, and compresses the stack 112 in a vertical plane against the base of the fixture using three closed-cell urethane rubber stamps 118, 119, and 120. The stack 112 is then cured at one hundred twenty degrees while remaining in the fixture to solidify the stack 112. The cure cycle includes a fifteen minute stabilization period, a sixty minute cure, and a ten minute cool down. The present invention is an improvement over prior methods in which individual die 32 are stacked, because the segments 36 comprising the stack 112 of the present invention may be of varying thickness and may be stacked in any order.

After the stack 112 solidifies, the edge bond pads 42 (see FIG. 3B) on each of the segments 36 is vertically electrically connected in the stack 112 in order to provide an electrically functional stack 112. Prior art methods for vertically connecting elements of a stack include connecting the elements with metal rods, and providing a plurality of vias in the elements and inserting an electrically conductive material in the vias, or filling the vias with a conductive liquid to provide an electrical path between the elements of the stack.

Referring to FIGS. 5A and 5B, a method for providing a vertical electrical path between segments 36 of a stack 112 is shown according to the present invention. FIG. 5A depicts a stack 112 from the backside 100 of the segments 36 with the stack positioned on its side. FIG. 5B depicts a view of the stack 112 from the front side 104 of the segments 36 where the stack is positioned vertically. To provide a vertical electrical path between segments 36 of a stack 112, silvered-filled conductive epoxy traces 130 are dispensed by a dispense mechanism 132 along the beveled edge walls 102 of the segments 36. The dispense mechanism 132 moves in an x- and y-direction and places the epoxy traces on the stack 112 in alignment with the external bond pads 42 of the segments 36. The epoxy traces 130 are applied to all four edges of the stack 112 in preprogrammed locations and the epoxy traces 130 flow to vertically connect the exposed metal of the bond pads 42. The beveled edge walls 102 of the segments 36 facilitate access to the external bond pads 42 by the epoxy traces 130. The use of beveled edge walls 102 and the epoxy traces 130 of the present invention is an improvement over prior art methods that use a layer of metallization to provide a vertical electrical connection to a stack.

As shown in FIGS. 5A and 5B, the epoxy traces 130 are selectively dispensed to different layers of the stack 112 according to preprogramming. The various epoxy traces 130 define circuit paths of a particular device and also route circuitry around disconnected defective die. When the segments 36 are stacked one on top of another to assemble a stack 112, each location of a die 32 on the segments 36 defines a vertical column in the stack 112. For example, if each segment 36 in a stack 112 includes six die 32, the stack 112 include six vertical columns of die 32. In order to have a functioning circuit, such as a memory circuit, a certain number of functioning die 32 is required in each vertical column of a segment 36. In a preferred embodiment, the circuitry of a stack 112 that includes six segments is routed during programming to provide four functioning die 32 in each column of the stack.

Further details of the VIP process are described in the cross referenced VIP patent application identified above, the details of which are hereby incorporated by reference.

DCP Process Overview

A general overview of the cross referenced patent application entitled "Conductive Epoxy Flip-Chip" will now be provided, in which a Direct Connect Process (DCP) is described in detail.

Referring to FIGS. 6A and 6B, a semiconductor chip 10 of the DCP process is shown. FIG. 6A is a perspective cut-away view of the chip 10 before it is flipped over and attached to PCB 12. FIG. 6B is a cross-sectional view of the chip 10, which is attached face-down on PCB 12 using electrically conductive epoxy 14. The chip 10 includes inner bond pads 16 for supplying power and transmitting data to and from the chip 10 in a conventional manner. Because the inner bond pads 16 are usually positioned on the chip 10 in dimensions that are to small to allow low cost PCB technology to make reliable contact, the inner bond pads 16 are rerouted to the external connection points 18, which are positioned on the chip 10 with the appropriate size and space. The inner bond pads 16 are re-routed to other areas on the chip 10 using a layer of metal 22, which also forms external connection points 18. The conductive epoxy 14 is applied between the external connection points 18 on the chip 10 and terminals 20 on the PCB 12 to both attach and electrically connect the chip 10 to the PCB 12.

Referring to FIG. 1, the process of rerouting inner bond pads 16 to the external connection points 18 of the present invention will be described, beginning with a standard wafer 30 which is supplied by a manufacturer. Semiconductor devices, such as memory chips 10, for example, are called "die" while in wafer form, and referred to as chips 10 once they are cut-out of the wafer 30. The squares on the wafer 30 indicate the locations of individual die 32 on the wafer 30. Wafers 30 normally arrive from the manufacturer with non-functioning or defective die which are marked with an ink dot 34. Typically, the wafer 30 is made of silicon, but alternate materials are also used, such as gallium arsenide as an example.

Referring to FIGS. 6A, 6B, and 1, the inner bond pads 16 on the chips 10 are usually covered with aluminum. The first step in the process of rerouting inner bond pads 16 to the external connection points 18 is to remove the aluminum from the inner bond pads 16 to prevent the formation of an undesirable gold/aluminum compound later on in the process. The aluminum is removed from the inner bond pads 16 using standard lithographic techniques. The wafer 30 is coated with photoresist and a slightly oversize image of the inner bond pads 16 is exposed using conventional masking techniques. The photoresist is developed away from the inner bond pads 16 and the aluminum is etched away using conventional semiconductor process techniques.

The next step in the process is to cover the entire wafer 30 with an insulating layer that usually comprises a liquid spin-on material. In a preferred embodiment, the wafer 30 is covered with a polyimide layer 26, although other materials such as spin-on glass, SiO2, Si3N4, etc. may also be used. A set of openings 36 are then made in the polyimide layer 26 over the inner bond pads 16 that are to be used in the final product. While there are many methods that can be used to make the openings 36, in a preferred embodiment, the openings 36 are made using conventional semiconductor processing techniques.

Next, a layer of metal layer 22 is applied to the surface of the wafer 30 and is patterned to allow signals from the inner bond pads 16 to be re-routed to the external contact points 18. Many well-known methods exist for the application and patterning of a metal interconnect layer. In the preferred embodiment of the present invention, a layer of photoresist (not shown) is applied to the wafer and a pattern is developed in the resist such that the resist is removed in the areas that define the intended path of the metal layer 22. After the photoresist is developed, the metal layer 22 is deposited on the chip 10. In a preferred embodiment, the metal layer 22 comprises a 2000 angstrom layer of chromium, a 500 angstrom layer of titanium tungsten, and a 1200 angstrom layer gold.

Once the metal layer 22 is applied to the chip 10, the metal layer 22 is patterned into a desired path by dissolving the photoresist remaining on the wafer 30, which causes the undesired metallization to float away with the dissolved photoresist. This is process is commonly known as a "lift-off" process.

After the metal layer 22 is patterned on the chip 10, the wafer 30 is covered with a second polyimide layer 28 for insulation. A second set of holes 38 are opened in the second polyimide layer 28 to expose the external contact points 18 formed by the metal layer 22.

Referring now to FIG. 7, the placement of the external connection points 18 on the chip 10 are shown according to the first preferred embodiment of the present invention. In the first preferred embodiment, the external connection points 18 are all positioned on the chip 10 internally from the edges 24 of the chip 10. The inner bond pads 16 included on the chips 10 act as connection points for the following standard signals: address (A0–A9), data (D1–D4), Row Address Strobe (RAS), Column Address Strobe (CAS), Write Enable (WE), Read Enable (OE), power (VCC), ground and ground (VSS).

As shown in FIG. 7, the layer of metal 22 functions to route each inner bond pad 16 to a corresponding external connection point 18 on the chip 10. The external connection points 18 are positioned with the appropriate size and spacing so that reliable and low-cost contact may be made with the external connection points 18 by the conductive epoxy 14 (FIGS. 6A and 6B).

Referring to FIGS. 6A, 6B and 1, after the first polyimide layer 26, the metal layer 22, and the second polyimide layer 26 are applied to the wafer 30, the die 32 are individual cut-out of the wafer 30. The die 32 that were identified as defective during the earlier testing are discarded. The die 32 are cut-out of the wafer 30 using conventional semiconductor wafer sawing and die-picking equipment. After the die 32 are cut-out, they are attached to a PCB 12 in order to create a memory module.

FIG. 8 is side view of a PCB 12 used to create a memory module according to the first preferred embodiment of the present invention. The PCB 12 includes positions P1 through P8 for accepting eight chips 10 (FIG. 6A). Each chip position P1–P8 includes a plurality of terminals 20 corresponding to the locations of the external connection points 18 on the chips 10. In order to connect the external connection points 18 of the chips 10 to the terminals 20 on the PCB 12, a controlled amount of conductive epoxy 14 is dispensed on each terminal 20 using commercially available automated epoxy dispense equipment 40.

Referring again to FIGS. 6A and 6B, before a reliable connection can be made to the external connection points 18, the external connection points 18 must be mechanically abraded in such a manner as to create a surface that is rough enough prevent the conductive epoxy 14 from forming an insulating layer, but not so rough as to damage the fragile semiconductor surface of the chip 10. This is accomplished by covering the chips 10 with an abrasive material and then bringing a artists' small paint brush alternately into and out of contact with the chips 10 in the region of the external contact points 18.

Referring to FIGS. 6A, 6B and 8, after the external connection points 18 are mechanically abraded, the chips 10 are placed in a fixture (not shown) that aligns the chips 10 with the eight chip positions P1–P8 on the PCB 12. Using the fixture, the chips 10 are then placed face-down on the PCB 12 in contact with the conductive epoxy 14 on the terminals 20. Spring pressure is applied to the fixture to insure that the chips 10 remains in contact with the conductive epoxy 14. After clamping, the entire assembly is heated to 120 C. for an hour to cure the conductive epoxy 14.

Referring now to FIG. 9, a cross-sectional view of a chip 10 is shown that has been attached to a PCB 12. A minimum bond line thickness is maintained between the chip 10 and a PCB 12 by mixing a small number of glass spheres 42 of a known size into the conductive epoxy 14, which lies between the external connection points 18 and the terminals 20. The glass spheres 42 are necessary to maintain a distance (D) between the chip 10 and the PCB 12. Otherwise, the chip 10 would be in contact with the PCB 12, and the different thermal expansion rates between the silicon in the chip 10 and the fiberglass of the of the PCB 12 could damage the chip 10 during use.

The conductive epoxy application of the present invention accomplishes the steps of both attaching chips 10 to a PCB 12 as well as electrically connecting the chips 10 to the PCB 12. Stated another way, the conductive epoxy 14 performs the function of both an adhesive and an electrical conductor.

After the chips 10 are attached to the PCB 12 with the conductive epoxy 14, the next step in the process is to burn-in (i.e. test) the PCB 12 by applying electrical power and input signals to the terminals 20 for an extended period of time at an elevated ambient temperature. Following the burn-in operation, the PCB 12 is subjected to an electrical test where its functional and parametric properties are tested. If one or more chips 10 are found to be electrically defective, then they are mechanically removed from the PCB 12. The terminals 20 under the defective chips 10 are cleaned-off, fresh conductive epoxy 14 is dispensed on the terminals 20, and a new chips 10 are placed in the terminals 20.

After the PCB 12 is tested, the chips 10 on the PCB 12 are covered with a conformal coating that will protect the chips 10 from mechanical and chemical damage. In a preferred embodiment, non-conductive epoxy (not shown) is dispensed over the entire surface and around the perimeter of each chip 10, such that there are no exposed areas of silicon. The non-conductive epoxy is then cured at 60° C. for 3 hours. The final step is to perform a minor electrical test on the PCB 12 and the PCB 12 is then packed for shipment.

Referring now to FIG. 10, a second preferred embodiment of attaching a chip 10 to a PCB 12 using electrically conductive epoxy 14 is shown. Instead of placing the chip 10 face-down on the PCB 12, the chip 10 is placed face-up on the PCB 12. As described in the first embodiment, the chip 10 is first covered with a polyimide layer 26 for insulation. The polyimide layer 26 supports the metal layer 22, which reroutes the inner bond pads 16 of the chip 10 to the external connection points 18. A second polyimide layer 28 covers and insulates the metal layer 22, and a second set of openings 38 are made in the second polyimide layer 28 over the external connection points 18. Conductive epoxy 14 is then dispensed on the external connection points 18, down a beveled edge wall 44 of the chip 10, and on the terminals 20 of the PCB 12, which are located beneath the external contact points 18.

Besides being placed face-up on the PCB 12, the chip 10 of the second preferred embodiment differs from the chip 10 of the first embodiment with respect to the positioning of the external contact points 18 on the chip 10.

Referring now to FIG. 11, the placement of the external connection points 18 on the chip 10 are shown according to the DCP process. In this process, the external connection points 18 are positioned along the edges 24 of the chip 10. As in the first process, the layer of metal 22 functions to route each inner bond pad 16 to a corresponding external connection point 18 on the chip 10. The chip 10 includes the same standard inner bond pads 16 as the chip 10 shown in FIG. 3: address (A0–A9), data (D1–D4), Row Address Strobe (RAS), Column Address Strobe (CAS), Write Enable (WE), Read Enable (OE), power (VCC), ground and ground (VSS).

Although the external connection points 18 are shown in FIG. 11 along two edges of the chip 10, the external connection points 18 may be located on any number of edges 24 defining the chip 10. The external connection points 18 may even occupy the same edge of the chip 10 that is occupied by the inner bond pads 16. This is accomplished by forming the layer of metal 22 into the external connection points 18 directly over the inner bond pads 16.

Referring to both FIGS. 1 and 10, the beveled edge wall 44 on the chip 10 is created by cutting the die 32 out of the wafer 30 using a saw blade (not shown) that has an angled cutting surface. Instead of cutting the die 32 from the front, the wafer 30 is sawn through from the back. The result is a beveled edge wall 44 that starts at the outer edge 24 of the chip 10 and slopes back toward the center of the chip 10 along all four edges 24 of the chip 10.

After the chip 10 is cut-out of the wafer 30, an insulating layer, such as silicon nitride, is sputtered on the back side of the chip 10 so as to cover the entire backside of the chip 10 including the beveled edges 44. The purpose of this step is to electrically insulate the semiconductor chip 10 from the conductive epoxy 14 that will be applied between the chip 10 and the PCB 12. Without the insulating layer, the epoxy 14 would contact both the terminals 20 on the PCB 12 and the silicon of the chip 10, which would short the chip 10.

One purpose of the beveled edge walls 44 on the chip 10 is to facilitate the sputtering of the silicon nitride along the sides of the chip 10. The silicon nitride could also be applied to the sides of the chip 10 without the beveled edge walls 44. After the back side of the chip 10 is insulated, the chip 10 is attached to a PCB 12.

FIG. 12 is side view of a PCB 12 used to create a memory module according to the second preferred embodiment of the present invention. The PCB 12 includes positions P1 through P8 for accepting eight chips 10. As shown, the terminals 20 in positions P1–P8 are located corresponding to the locations of the external connection points 18 on the chips 10 once the chips 10 are placed on the PCB 12.

To attach the chips 10 to the PCB 12, a conventional surface mount adhesive 46 is dispensed in between the terminals 20 where the chips 10 are to be attached. The chips 10 are placed in a fixture (not shown) that aligns the chips 10 with the positions P1-P8 on the PCB 12, and the chips 10 are then placed on the adhesive with enough force to insure a good adhesive bond.

Referring to FIG. 13, a side view of a chip 10 attached to a PCB 12 is shown. According to one aspect of the DCP process, the bond line thickness between the chips 10 and the PCB 12 is controlled by adding glass spheres 42 of the appropriate diameter to the surface mount adhesive 46. As shown, the glass spheres 42 maintain a distance (D) between the chip 10 and the PCB 12. After the chips 10 are placed in contact with the surface mount adhesive 46, the surface mount adhesive 46 is cured for 10 minutes at 60° C.

After the surface mount adhesive 46 is cured, conductive epoxy 14 is dispensed between each of the external contact points 18 and the terminals 20 on the PCB 12. This is accomplished with conventional X/Y liquid dispense mechanism 40. The conductive epoxy 14 is then cured at 120° C. for 60 minutes.

As in the first DCP process, the last step is to coat all the chips 10 on the PCB 12, test the PCB 12, and then pack the PCB 12 for shipment. This second DCP process has the advantage of allowing each connection between the external contact points 18 and the terminals to be visually inspected, since the chips 10 are attached face-up.

FLIP-CHIP ON CHIP EMBODIMENTS

Now that a general overview of the VIP and DCP processes has been provided, a detailed description of the preferred embodiments of the flip-chip on chip process according to the present invention will now be provided.

In one preferred embodiment, the present invention provides a flip chip assembly including a first flip chip; a second flip chip directly connected to the top of the first flip chip; and electrically conductive epoxy means disposed between the second flip chip and the top of the first flip chip to form an electrical connection between the first flip chip and the second flip chip.

In another preferred embodiment, the present invention provides a flip chip assembly including a plurality of semiconductor chips where the plurality of chips are vertically interconnected on top of one another to form an electrically interconnected stack of chips; a flip chip directly connected to the top chip of the stack of chips; and electrically conductive epoxy means disposed between said flip chip and said top chip to form an electrical connection between the flip chip and the top chip.

In still another preferred embodiment, the present invention provides a flip chip assebmly including a semiconductor wafer having a plurality of first flip-chips formed thereon; a plurality of second flip chips, each one of the second flip chips directly connected to a respective one of the plurality of first flip-chips; and electrically conductive epoxy means disposed between the respective first flip-chip and second flip-chip connections to form an electrical connection between the respective first flip-chip and second flip chip connections.

In still another further embodiment of the present invention a flip chip assembly is provided which includes a first flip chip mounted on a lead frame where the top portion of the first flip chip is wire bonded to said lead frame; a second flip chip where the top portion of the second flip chip is directly connected to the top portion of the first flip chip; electrically conductive epoxy means disposed between the top portion of the second flip chip and the top portion of the first flip chip to form an electrical connection between the first flip chip and the second flip chip; and a third chip having a bottom portion placed on top of the bottom portion of the second flip chip where the third chip is electrically disconnected from the second chip, and where the third chip is wire bonded to the lead frame.

As will be described in more detail below, the present invention provides several very desirable features, including the ability to: (1) bond one die to another die in a flip chip fashion; (2) the ability to add a third die on top of the two flip chip die arrangement and wire bond that combination of three dies with two sets of wire bonds; and (3) the ability to further enhance the improved flip chip arrangement by combining the flip chip process (DCP) with the vertical integration process (VIP) previously described to allow for the stacking of a plurality of die (e.g., N die). In one preferred embodiment, there could be a VIP stack of eight die, and one additional die could be stacked according to the flip chip on chip process of the present invention so as to provide a vertical stack of nine die. In still another embodiment, a VIP stack of eight die could be interconnected via the VIP process and an additional die could be connected to a respective VIP die via the flip chip on chip process to be described.

The flip chip on chip process according to the present invention provides for higher die density in the same board area and a reduction in the number of wires bonds that are required (therefore enhancing the reliability).

FIG. 14 shows a first embodiment of a flip chip on chip process according to the present invention. In FIG. 14, the present invention provides the ability to bond one die 150 to another die 152 in a flip chip fashion. The flip chip on chip in FIG. 14 includes a die 150 which is flipped over to electrically interconnect with die 152. Die 152 of FIG. 14 is electrically connected to lead frame 154 via wire bonds 156. Die 150, 152 are electrically connected to one another via conductive epoxy 160 around glass spheres 162. As with the DCP process, the glass spheres 162 maintain a predetermined distance or stand-off between the die 150, 152. Other suitable ways of maintaining a predetermined distance between the die 150, 152 are possible.

FIG. 15 shows another embodiment of the present invention of a flip chip on chip. In FIG. 15, chip 150 is flip chip bonded to chip 152 and then mounted on a lead frame 154 and electrically interconnected via conductive epoxy 160. Die 150, 152 are separated from one another by a predetermined distance by means of glass spheres 162. Wire bonds 156 electrically connect the flip chip on chip combination to lead frame 154. Die 150 is upside down on top of die 152, and wire bonds 156 connect to lead frame 154.

FIGS. 16 A and 16B show the original pads 180, 190 of each die 150, 152 of FIG. 15 which are re-routed from their original locations 180, 190 to new locations' 184, 194, respectively, via interconnects 182, 192. The pad locations on the bottom die 152 and top die 150 are aligned so that their respective pad locations 194, 184 coincide in an X, Y dimension. As will be understood, the top portion 186 of die 150 is flipped over onto the top portion 196 of die 154, thereby providing a flip chip on chip assembly according to the present invention.

The conductive epoxy 160 and glass spheres 162 shown in FIG. 15 provide an electrical interconnection between relocated pads 194 in the bottom die 152 and the relocated pads 184 on the top die 150 in a flip chip arrangement as well as maintaining a certain distance between die 150, 152.

In FIG. 15, a further aspect of the present invention is shown in which another die 170 is placed on top of the flip chip on chip "sandwich" configuration, and specifically on top of die 150. The bottom portion of die 170 is placed on the bottom portion of die 150 (the top portion of die 150 is flip chipped on the top portion of die 152, as shown in FIGS. 16 A and 16 B) In FIG. 15, die 170 has no electrical bonding to the die 150. Instead, die 170 is wire bonded to lead frame 154 via wire bonds 172, allowing for the combination of three die in the same assembly, as shown in FIG. 15.

FIG. 17 provides the capability of an improved flip chip on chip process in which one die 202 is flip chipped onto another die 204. The die 202 is electrically interconnected to die 204 via conductive epoxy 206 in a manner similar to the flip chip on chip configurations shown in FIGS. 14, 15, 16 A and 16 B. The distance between die 202, 204 is maintained by glass spheres 208.

FIG. 17 shows die 202 bonded to die 204 in a DCP or flip chip manner. According to another aspect of the present invention, die 204 is electrically interconnected to die 210 via VIP interconnect 212. The VIP interconnect 212 is achieved by means of the VIP process described above. Hence, the top face of die 204 is configured so as to be electrically interconnected to die 202 via the flip chip on chip process via conductive epoxy 206 and the distance between die 202 and 204 is maintained via glass spheres 208. Die 204 is configured to electrically interconnect to die 210 via the VIP process described above.

Similarly, die 210 is electrically interconnected to a substrate 220 via VIP interconnect 222. The substrate 220 is electrically interconnected to lead frame 224 via solder balls 226. Die 204 and 210 have beveled edge walls 228, 230, respectively, in accordance with the VIP process. The flip chip on chip process according to the present invention provides vertical electrical interconnections for a module stack, such as shown in FIG. 17, in which the DCP process is combined with the VIP process, both of which have been described above.

The present invention provides several desirable features, which include first, the ability to bond one die to another in a flip chip fashion; second, the ability to add a die on top of that and wire bond the combination of three dies out with two sets of wire bonds; and third, the ability to take the flip chip on chip combination combined with the vertical interconnect process to provide a stack of N die. As an example, FIG. 17 shows three die but the number of die could be N die. For example, a multichip stack could have eight VIP die or chips and include one additional die or chip on top of the stack upside down in the flip chip or DCP manner so as to provide a stack of nine die or chips.

The present invention provides for higher density, so that more chips can be stacked in the same board area. The present invention also provides simplicity; in that when die are flip chipped from one die to another, the total number of wire bonds that are required are reduced, therefore enhancing the reliability. As an example, if two separate chips each with 100 pins were to be stacked, it would normally require 100 wires from one chip and 100 wires from the other chip (a total of 200 wires). There is a possibility that one or more of those wires would result in a bad electrical connection in such a configuration.

With the present invention, with the flip chip assembly of one die to another, only 100 wires are being bonded (instead of 200 wires). The present invention provides a direct connection between one chip and another chip via the DCP process, but now both chips are silicon chips as opposed to one being a chip and one being a substrate.

FIG. 17 shows the combination of the DCP and VIP process according to the present invention. In FIG. 17, there are three VIP process in combination with one DCP process on top of the stack. However, it should again be pointed out that there is no limit to the number of VIP processes which can be combined with the one DCP process. For example, in on e embodiment, eight VIP processes could be combined with one DCP process.

In another embodiment of the present invention, the flip-chip on chip aspect could be utilized with a semiconductor wafer having a plurality of flip-chips or die formed thereon. More specifically, a semiconductor wafer 30 such as shown in FIG. 1 could be utilized with the flip-chip on chip process according to the present invention. The flip-chip on chip process could be achieved by having each of the die 32 on the wafer 30 of FIG. 1 configured in a flip-chip manner such as shown with the die 152 in FIG. 16B. With such a wafer configuration, individual chips or die such as die 150 shown in FIG. 16A could be flip-chipped onto the corresponding flip-chips formed on the configured wafer 30. The individual flip-chip on chip assemblies formed thereon could then be cut from the wafer 30 in accordance with suitable cutting techniques. This flip-chip on chip aspect, when utilized with semiconductor wafers such as shown in FIG. 1, would allow for automated techniques in producing a very high volume of flip-chip on chip assemblies.

FIG. 18 shows still another embodiment of the present invention in which a VIP stack of eight die are interconnected via the VIP process and an additional die is connected to a respective VIP die via the flip chip on chip process described above. In FIG. 18, there are eight layers of the VIP/DCP stack 300. In each layer of the eight layers, the flip chip bottom die 309 are interconnected via vertical interconnect 311 via the VIP process described above and the VIP portion of the stack 300 is connected to baseplate 310. Each flip chip bottom die 309 in turn has a flip chip top die 308 electrically connected to the respective bottom die 309 via the flip chip on chip process described above. The VIP/DCP stack 300 shown in FIG. 18 provides for sixteen die arranged in the VIP/DCP stack 300, in one preferred embodiment. Other configurations of the VIP/DCP features are also possible.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. The method comprising the steps of:
   providing a first flip chip having at least one first die;
   connecting a second flip chip having at least one second die directly to the top of said first flip chip; and
   disposing electrically conductive epoxy means between said second flip chip and said top of said first flip chip to form an electrical connection between said first flip chip and said second flip chip and the respective first and second die.

2. The method comprising the steps of:
   providing a plurality of semiconductor chips each having at least one first die;
   vertically interconnecting said plurality of chips on top of one another to form an electrically interconnected stack of chips and the respective first die;
   connecting a flip chip having at least one second die directly to the top chip of said stack of chips; and
   disposing electrically conductive epoxy means between said flip chip and said top chip to form an electrical connection between said flip chip and said top chip and the respective second die and the first die on the top chip.

3. The method comprising the steps of:
   providing a semiconductor wafer having a plurality of first flip-chips formed thereon, each of said first flip chips each having at least one first die;
   providing a plurality of second flip chips each having at least one second die;
   connecting each one of said second flip chips directly to a respective one of said plurality of first flip-chips; and
   disposing electrically conductive epoxy means between the respective first flip-chip and second flip-chip connections to form an electrical connection between said respective first flip-chip and second flip chip connections and the respective first and second die.

4. The method comprising the steps of:
   providing a first flip-chip and a second flip-chip where said first flip-chip and said second flip-chip each include at least one first die and at least one second die, respectively, a plurality of terminals and a plurality of inner bond pads;
   covering said flip chip with a first insulation layer;
   exposing a first plurality of holes in said first insulation layer so as to expose said inner bond pads;
   disposing at least one metal layer over said first insulation layer in contact with said inner pads;
   disposing at least one second insulation layer over said metal layer;
   exposing a second plurality of holes in said second insulation layer so as to expose selected portions of said metal layer to form external connection points; and
   disposing electrically conductive epoxy means between said external connection points of said first flip-chip and said second flip-chip, thereby electrically connecting said first flip-chip and said second flip-chip and the respective first and second die.

5. The method as in claim 4, including the step of disposing said second flip chip face down on said first flip chip such that said external connection points are positioned directly above one another.

6. The method comprising the steps of:
   providing a first flip chip and a second flip chip where said first flip chip and said second flip chip each include at least one first die and at least one second die, respectively, a plurality of terminals and a plurality of inner bond pads;
   covering each flip chip with a first insulation layer,
   exposing a first plurality of holes in said first insulation layer so as to expose said inner bond pads,
   disposing a metal layer over said first insulation layer in contact with said inner bond pads,
   disposing a second insulation layer over said metal layer,
   exposing a second plurality of holes in said second insulation layer so as to expose selected portions of said metal layer to form external connection points, said external connection points being located internally on said flip-chip;
   disposing said second flip-chip face down on said first chip face-down such that said external connection points are positioned directly above said terminals on said first chip; and
   disposing electrically conductive epoxy between said external connection points of said first flip-chip and said second flip first chip, thereby electrically connecting said first flip chip to said second flip chip and the respective first and second die.

7. The method comprising the steps of:
   providing a first flip-chip and a second flip-chip where said first flip-chip and said second flip-chip each include at least one first die and at least one second die, respectively, a plurality of terminals and a plurality of inner bond pads;
   covering said flip chip with a first insulation layer;
   exposing a first plurality of holes in said first insulation layer so as to expose said inner bond pads;
   disposing a plurality of metal layers over said first insulation layer in contact with said inner pads;
   disposing a plurality of second insulation layers over a respective one of said metal layers;
   exposing a second plurality of holes in said second insulation layers so as to expose selected portions of said metal layers to form external connection points; and disposing electrically conductive epoxy means between said external connection points of said first flip-chip and said second flip-chip, thereby electrically connecting said first flip-chip and said second flip-chip and the respective first and second die.

8. The method comprising the steps of:

providing a first flip chip having at least one first die;

connecting a second flip chip having at least one second die directly to the top of said first flip chip; and disposing electrically conductive epoxy means between said second flip chip and said top of said first flip chip to form an electrical connection between said first flip chip and said second flip chip and the respective first and second die and to maintain a predetermined distance between said first flip chip and said second flip chip.

9. The method as in claim 8 wherein the predetermined distance is maintained by using glass spheres.

10. The method comprising the steps of:

providing a plurality of semiconductor chips each having at least one first die;

vertically interconnecting said plurality of chips on top of one another to form an electrically interconnected stack of chips and the respective first die;

connecting a flip chip having at least one second die directly to the top chip of said stack of chips; and disposing electrically conductive epoxy means between said flip chip and said top chip to form an electrical connection between said flip chip and said top chip and to maintain a predetermined distance between said flip chip and said top flip chip and the second die and the respective first die.

11. The method as in claim 10 wherein the predetermined distance is maintained by using glass spheres.

12. The method comprising the steps of:

providing a semiconductor wafer having a plurality of first flip-chips formed thereon, said first flip chips each having at least one first die;

providing a plurality of second flip chips each having at least one second die;

connecting each one of said second flip chips directly to a respective one of said plurality of first flip-chips; and disposing electrically conductive epoxy means between the respective first flip-chip and second flip-chip connections to form an electrical connection between said respective first flip-chip and second flip chip connections and said top chip and the respective first and second die and to maintain a predetermined distance between said first flip chip and said second flip chip.

13. The method as in claim 12 wherein the predetermined distance is maintained by using glass spheres.

14. The method comprising the steps of:

providing a first group of flip chips each having at least one first die;

connecting a respective one of a second group of flip chips each having at least one second die directly to the top of a respective one of said first group of flip chips;

disposing electrically conductive epoxy means between the respective ones of said second group of flip chips and said first group of flip chips to form an electrical connection therebetween and the respective first and second die; and vertically interconnecting said first group of flip chips to a baseplate to form an electrically interconnected stack of chips.

* * * * *